US010635532B2

(12) United States Patent
Kim et al.

(10) Patent No.: US 10,635,532 B2
(45) Date of Patent: Apr. 28, 2020

(54) METHOD OF CONTROLLING ERROR CHECK AND CORRECTION (ECC) OF NON-VOLATILE MEMORY DEVICE AND MEMORY SYSTEM PERFORMING THE SAME

(71) Applicant: SAMSUNG ELECTRONICS CO., LTD., Suwon-si, Gyeonggi-do (KR)

(72) Inventors: Ji-Suk Kim, Seoul (KR); Sang-In Park, Anyang-si (KR); Il-Han Park, Suwon-si (KR); Sang-Yong Yoon, Seoul (KR); Gyu-Seon Rhim, Uijeongbu-si (KR); Sung-Woon Choi, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 100 days.

(21) Appl. No.: 15/901,175

(22) Filed: Feb. 21, 2018

(65) Prior Publication Data

US 2019/0026181 A1  Jan. 24, 2019

(30) Foreign Application Priority Data

Jul. 19, 2017  (KR) .......................... 10-2017-0091656

(51) Int. Cl.
| | | |
|---|---|---|
| *G06F 11/10* | (2006.01) | |
| *G11C 16/28* | (2006.01) | |
| *H03M 13/37* | (2006.01) | |
| *G11C 29/52* | (2006.01) | |
| *G11C 16/26* | (2006.01) | |
| *G11C 7/10* | (2006.01) | |
| *G11C 29/00* | (2006.01) | |
| *G11C 16/04* | (2006.01) | |

(52) U.S. Cl.
CPC ........ *G06F 11/1068* (2013.01); *G11C 7/1006* (2013.01); *G11C 16/26* (2013.01); *G11C 16/28* (2013.01); *G11C 29/52* (2013.01); *H03M 13/3707* (2013.01); *G11C 16/0483* (2013.01); *G11C 29/70* (2013.01)

(58) Field of Classification Search
CPC .................................................. G06F 11/1076
USPC ......................................... 714/764, 763, 767
See application file for complete search history.

(56) References Cited

U.S. PATENT DOCUMENTS

| | | | |
|---|---|---|---|
| 7,571,291 B2 | 8/2009 | Sasage et al. | |
| 8,291,181 B2 | 10/2012 | Manning | |
| 8,520,434 B2 | 8/2013 | Kang et al. | |
| 8,996,951 B2 | 3/2015 | Hyde et al. | |

(Continued)

FOREIGN PATENT DOCUMENTS

| | | |
|---|---|---|
| JP | 2013-186857 A | 9/2013 |
| KR | 10-0609540 B1 | 7/2006 |

*Primary Examiner* — Fritz Alphonse
(74) *Attorney, Agent, or Firm* — Lee IP Law, P.C.

(57) ABSTRACT

A method for controlling error check and correction (ECC) of a non-volatile memory device includes storing write data in a plurality of storing regions. The write data may be generated by performing ECC encoding. Individual ECC decoding may be performed based on each of a plurality of read data read out from the storing regions. Logic operation data may be provided by performing a logic operation of the read data when the individual ECC decoding fails with respect to all of the read data. Combined ECC decoding may be performed based on the logic operation data.

20 Claims, 29 Drawing Sheets

(56) References Cited

U.S. PATENT DOCUMENTS

| | | |
|---|---|---|
| 9,280,431 B2 | 3/2016 | Best et al. |
| 9,396,068 B2 | 7/2016 | Dennett et al. |
| 2009/0055906 A1* | 2/2009 | von Wendorff ..... G06F 12/1425 726/5 |
| 2010/0332895 A1* | 12/2010 | Billing ................ G06F 11/1008 714/6.13 |
| 2012/0324314 A1* | 12/2012 | Seshadri ............. G06F 11/1048 714/773 |
| 2015/0199234 A1* | 7/2015 | Choi ...................... G11C 29/42 714/764 |
| 2017/0075757 A1* | 3/2017 | Im ....................... G06F 11/1068 |

* cited by examiner

|  |  | 1(PASS) | 0(FAIL) |
|---|---|---|---|
| DTR1 | | 0.9 | 0.1 |
| DTR2 | | 0.9 | 0.1 |
| 1-1 | | 0.81 | |
| 1-0 | | 0.09 | |
| 0-1 | | 0.09 | |
| 0-0 | | 0.01 | |
| DTOR | 1(PASS) | 0.99 | |
| | 0(FAIL) | 0.01 | |

| | | 1(FAIL) | 0(PASS) |
|---|---|---|---|
| DTR1 | | 0.1 | 0.9 |
| DTR2 | | 0.1 | 0.9 |
| 0-0 | | 0.81 | |
| 0-1 | | 0.09 | |
| 1-0 | | 0.09 | |
| 1-1 | | 0.01 | |
| DTAND | 0(PASS) | 0.99 | |
| | 1(FAIL) | 0.01 | |

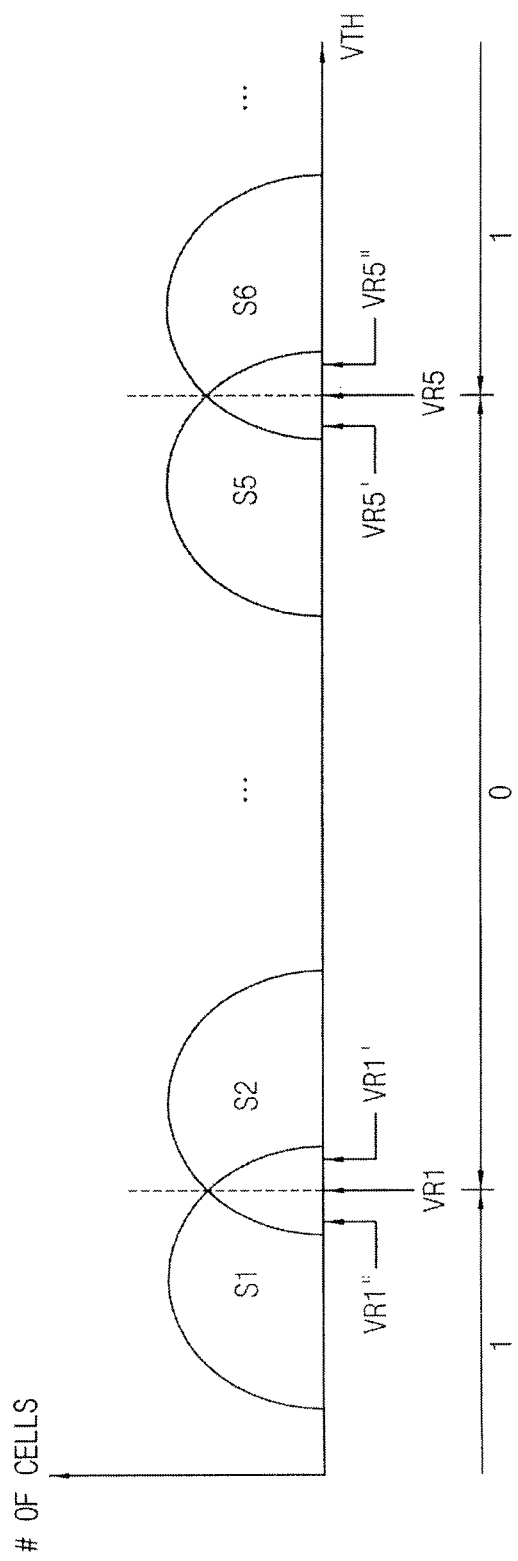

FIG. 25B

|  |  | NO LO ||| | OR |||| AND |||| OR | AND |
|---|---|---|---|---|---|---|---|---|---|---|---|---|---|---|---|
|  |  | 1→1 | 1→0 | 0→1 | 0→0 | ER1 | 1→1 | 1→0 | 0→1 | 0→0 | 1→1 | 1→0 | 0→1 | 0→0 | ER2 | ER3 |
| CASE1 | DTR1 | 0.99 | 0.01 | 0 | 1 | 0.01 | 0.99993 | 0.00007 | 0.00250 | 0.99750 | 0.98258 | 0.01743 | 0.00000 | 1.00000 | 0.00258 | 0.01743 |
|  | DTR2 | 0.9925 | 0.01 | 0 | 1 | 0.01 |  |  |  |  |  |  |  |  |  |  |
| CASE2 | DTR1 | 0.99 | 0.0075 | 0.0025 | 0.9975 | 0.01 | 0.99995 | 0.00005 | 0.00500 | 0.99500 | 0.98505 | 0.01495 | 0.00000 | 1.00000 | 0.00505 | 0.01495 |
|  | DTR2 | 0.995 | 0.0075 | 0.0025 | 0.9975 | 0.01 |  |  |  |  |  |  |  |  |  |  |
| CASE3 | DTR1 | 0.99 | 0.005 | 0.005 | 0.995 | 0.01 | 0.99998 | 0.00002 | 0.00750 | 0.99250 | 0.98753 | 0.01248 | 0.00000 | 1.00000 | 0.00753 | 0.01248 |
|  | DTR2 | 0.9975 | 0.005 | 0.005 | 0.995 | 0.01 |  |  |  |  |  |  |  |  |  |  |
| CASE4 | DTR1 | 0.99 | 0.0025 | 0.0075 | 0.9925 | 0.01 | 1.00000 | 0.00000 | 0.01000 | 0.99000 | 0.99000 | 0.01000 | 0.00000 | 1.00000 | 0.01000 | 0.01000 |
|  | DTR2 | 1 | 0 | 0.01 | 0.99 | 0.01 |  |  |  |  |  |  |  |  |  |  |
|  |  | ←CL1 | ←CL2 | ←CL3 | ←CL4 | ←CL5 | ←CL6 | ←CL7 | ←CL8 | ←CL9 | ←CL10 | ←CL11 | ←CL12 | ←CL13 | ←CL14 | ←CL15 |

METHOD OF CONTROLLING ERROR CHECK AND CORRECTION (ECC) OF NON-VOLATILE MEMORY DEVICE AND MEMORY SYSTEM PERFORMING THE SAME

CROSS-REFERENCE TO RELATED APPLICATION

Korean Patent Application No. 10-2017-0091656, filed on Jul. 19, 2017, and entitled, "Method of Controlling Error Check and Correction (ECC) of Non-Volatile Memory Device and Memory System Performing the Same," is incorporated by reference herein in its entirety.

BACKGROUND

1. Field

One or more embodiments described herein relate to a non-volatile memory device and a memory system.

2. Discussion of the Related Art

Semiconductor memory devices may be classified as volatile memory devices or non-volatile memory devices. Volatile memory devices (e.g., dynamic random access memory (DRAM) devices) may store data by charging or discharging capacitors in memory cells. The stored data is lost when power is turned off. Non-volatile memory devices (e.g., flash memory devices) retain stored data when power is turned off. Because of these differences, volatile memory devices are widely used as main memories of various apparatuses. Non-volatile memory devices are widely used for storing program code and/or data in computers, mobile devices, and other electronic products.

Attempts are continually being made to increase the storage capacity of semiconductor memory devices by increasing integration. As the degree of integration increases, the likelihood of their being more defective memory cells increases and, conversely, yield may decrease. Redundant memory cells may be used or an ECC operation may be performed to repair defective memory cells, but these approaches, as presently constituted, have been found to have drawbacks.

SUMMARY

In accordance with one or more embodiments a method for controlling error check and correction (ECC) of a non-volatile memory device includes storing write data in a plurality of storing regions of the non-volatile memory device, the write data generated by performing ECC encoding; performing individual ECC decoding based on each of a plurality of read data that are read out from the plurality of storing regions; providing logic operation data by performing a logic operation of the plurality of read data when the individual ECC decoding fails with respect to all of the plurality of read data; and performing a combined ECC decoding based on the logic operation data.

In accordance with one or more other embodiments, a memory system includes an error check and correction (ECC) encoder to perform an ECC encoding to generate write data; a non-volatile memory device to store the write data in a plurality of storing regions of the non-volatile memory device; and an ECC decoder to perform an individual ECC decoding based on each of a plurality of read data that are read out from the plurality of storing regions, provide logic operation data by performing a logic operation of the plurality of read data when the individual ECC decoding fails, and perform a combined ECC decoding based on the logic operation data.

In accordance with one or more other embodiments, a method for controlling error check and correction (ECC) of a non-volatile memory device includes storing write data in a plurality of storing regions of the non-volatile memory device, the write data generated by performing an ECC encoding; providing at least one of OR data and AND data by performing at least one of a bit-by-bit OR operation of the plurality of read data and a bit-by-bit AND operation of the plurality of read data; and performing a combined ECC decoding based on the logic operation data.

In accordance with one or more other embodiments, a non-transitory computer-readable medium comprises code, which, when executed by a processor, causes the processor to control error check and correction (ECC) of a non-volatile memory device. The medium includes code to store write data in a plurality of storing regions of the non-volatile memory device, the write data generated by performing ECC encoding; code to perform individual ECC decoding based on each of a plurality of read data that are read out from the plurality of storing regions; code to provide logic operation data by performing a logic operation of the plurality of read data when the individual ECC decoding fails with respect to all of the plurality of read data; and code to perform a combined ECC decoding based on the logic operation data.

BRIEF DESCRIPTION OF THE DRAWINGS

Features will become apparent to those of skill in the art by describing in detail exemplary embodiments with reference to the attached drawings in which:

FIG. 23 illustrates another embodiment of a read condition change and a combined ECC operation;

FIGS. 25A and 25B illustrate embodiments of ratios for combined ECC decoding.

DETAILED DESCRIPTION

Figure 1:
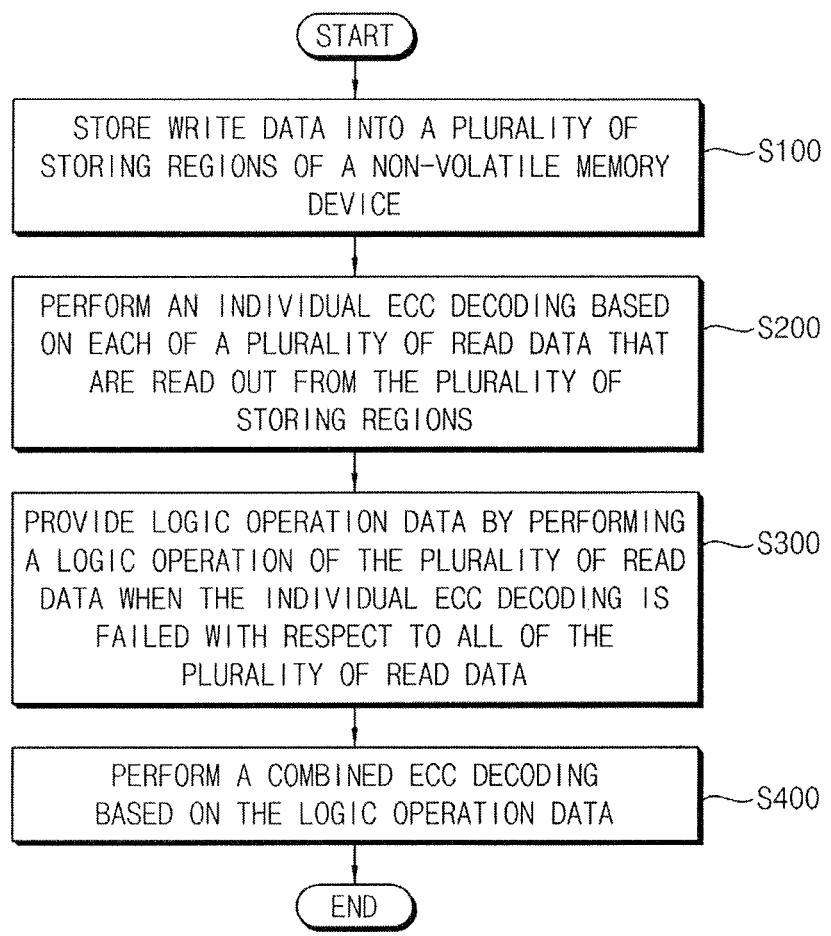
FIG. 1 illustrates an embodiment of a method for controlling ECC of a non-volatile memory device.

FIG. 1 illustrates an embodiment of a method for controlling error check and correction (ECC) of a non-volatile memory device. Referring to FIG. 1, write data are stored in a plurality of storing regions of the non-volatile memory device. The write data may be generated by performing an ECC encoding (S100). An individual ECC decoding is performed based on each of a plurality of read data that are read out from the plurality of storing regions (S200).

Data mirroring may be performed in some data storage environments to enhance reliability of stored data. For example, the same data may be stored in a plurality of storage regions to prevent loss of information using back data if main data are damaged. Nevertheless, data recovery may be impossible if all the data in the plurality of storage regions are defective.

The data mirroring may enhance reliability of a memory device based on the fact that a probability of simultaneous defects of multiple storage regions is lower than that of a single storage region. A prediction of a probable defect of stored data may be difficult in some circumstances, and real situations may deviate from the prediction in many cases such as data program at the end of Program/Erase (P/E) cycle, unexpected long neglect of stored data, etc.

According to example embodiments, logic operation data may be provided by performing a logic operation of the plurality of read data when individual ECC decoding fails with respect to all of the plurality of read data (S300). A combined ECC decoding based on the logic operation data may be performed (S400).

In some example embodiments, as illustrated in FIG. 1, the individual ECC decoding may be performed first and, then, the combined ECC decoding may be performed only if individual ECC decoding fails. In other example embodiments, the individual ECC decoding may be omitted and the combined ECC decoding may be performed directly. For example, if the P/E cycle approaches a limit value, the fail bit number may increase significantly and the probability of failure of the individual ECC decoding is very high. In this case, individual ECC decoding may be omitted and combined ECC decoding may be performed based on the logic operation data.

Thus, the method of controlling ECC of non-volatile memory device according to example embodiments may correct errors through combined ECC decoding based on the logic operation data, even though each of the plurality of read data is uncorrectable. As a result, yield, reliability and the lifetime of the non-volatile memory device may be enhanced.

Figure 2A:
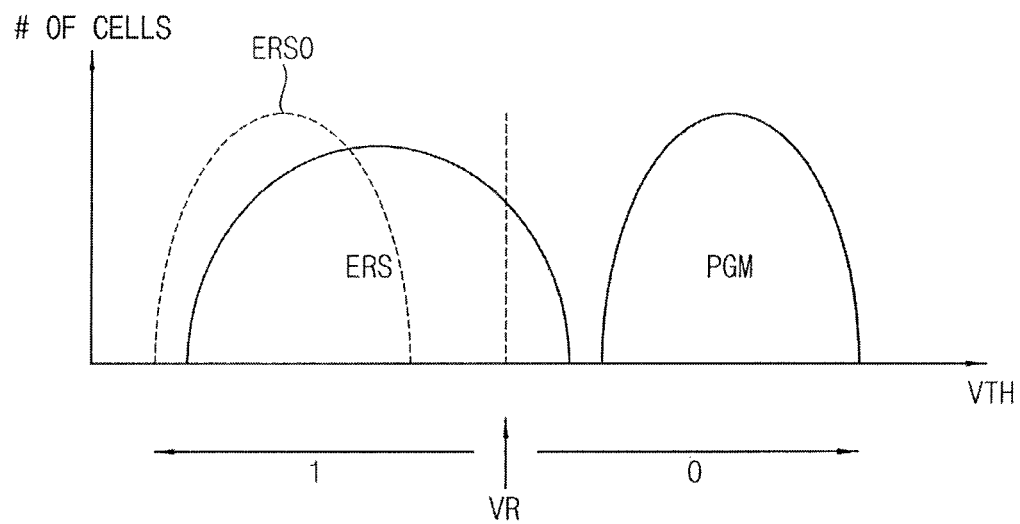
FIGS. 2A to 2D illustrate embodiments of combined ECC decoding.

FIGS. 2A to 2D illustrate an embodiment for performing combined ECC decoding based on OR data. In FIG. 2A, the horizontal axis represents a threshold voltage VTH of memory cells and the vertical axis represents the number of the memory cells corresponding to the threshold voltage VTH. Through a read operation, the memory cells distributed at the left side of the read voltage VR may output a value of 1. The memory cells distributed at the right side of the read voltage VR may output a value of 0. The threshold voltage of the memory cells are distributed in a wide range because the memory cells have different characteristics. Even though the threshold voltage VTH of 1 and 0 memory cells may be gathered in the left and right sides through the erase operation and the programming operation, the distribution of the threshold voltage may not be concentrated in narrow regions due to the different cell characteristics.

FIG. 2A illustrates an example of the degeneration of NAND cells where an original erased state ERS0 is changed to a degenerated erased state ERS. As the P/E cycle increase, the distribution of the erased state ERS moves to the right direction, e.g., the direction to increase the threshold voltage VTH. If the read operation to determine the programmed state PGM or the erased state ERS is repeated using the read voltage VR, the distribution of the erased state ERS may also move to the right direction, which may be referred to as "read disturbance".

Figure 2B:
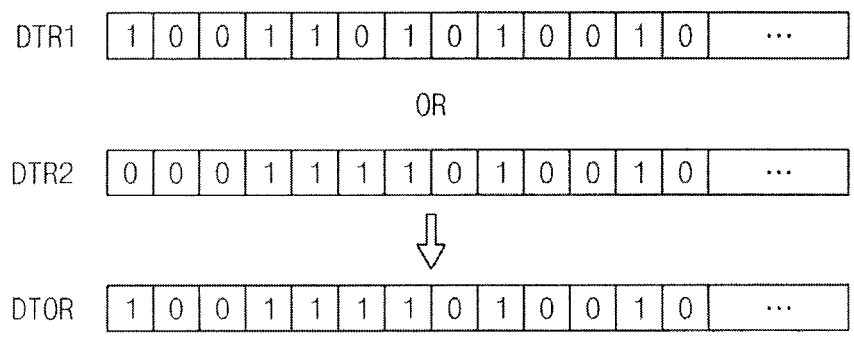

FIG. 2B corresponds to the case where 1 is read out wrongly as 0. In this case, the fail bit number may be reduced using an OR operation of the plurality of read data. Referring to FIG. 2B, even though the same write data are stored in the plurality of storage regions, the read data may be different due to different degeneration characteristics, etc. For example, as illustrated in FIG. 2B, at least one bit of first read data DTR1 and second read data DTR2 may be different. OR data DTOR may be provided by performing a bit-by-bit OR operation of the first read data DTR1 and the second read data DTR2.

Figures 2C, 2D:
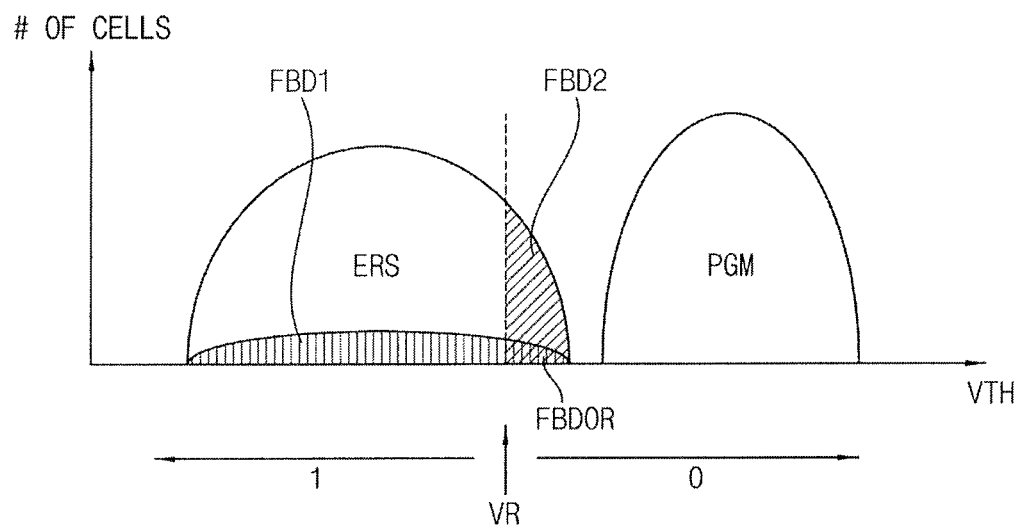

FIG. 2C illustrate, with respect to the memory cells corresponding to the erased state ERS, the fail bits FBD1 of the first read data DTR1 and the fail bits FBD2 of the second read data DTR2. The fail bits are represented as hatched areas. The memory cells in the erased state have to be read out as 1, but the memory cells having the threshold voltage VTH higher than the read voltage VR are read out wrongly as 0. This read error may be referred to as 0-error.

The bits of the first read data DTR1 corresponding to the 0-error fail bits FBD2 of the second read data DTR2 may be distributed uniformly in the threshold voltage range of the erased state ERS. Accordingly the fail bits FBDOR corresponding to the 0-error in both of the first read data DTR1 and the second read data DTR2 are reduced significantly. Thus, the 0-error fail bits FBDOR of the OR data DTOR are reduced significantly in comparison with each of the 0-error fail bits FBD1 of the first read data DTR1 and the 0-error fail bits FBD2 of the second read data DTR2.

FIG. 2D illustrates the reduction of the 0-error fail bits through the OR operation of the first read data DTR1 and the second read data DTR2. As an example, it is assumed that each ratio of the 0-error fail bits of the first read data DTR1 and the second read data DTR2 is 0.1 (e.g., 10%). In this case, with respect to the read result of the OR operation, the ratio of 1-1 case is 0.81, the ratio of 1-0 or 0-1 case is 0.09 and the ratio of 0-0 case is 0.01. Thus the 99% bits of the OR data DTOR are 1 normally and only the 1% bits of the OR data DTOR corresponds to the 0-error fail bits.

For example, assuming the error rate of 1% of the OR data DTOR, each of the first read data DTR1 and the second read data DTR2 may allow the error rate of 10%. As a result, in case of degeneration characteristics of FIG. 2A, the probability of pass or success of error correction may be increased using the combined ECC decoding based on the OR data DTOR.

Figure 3A:
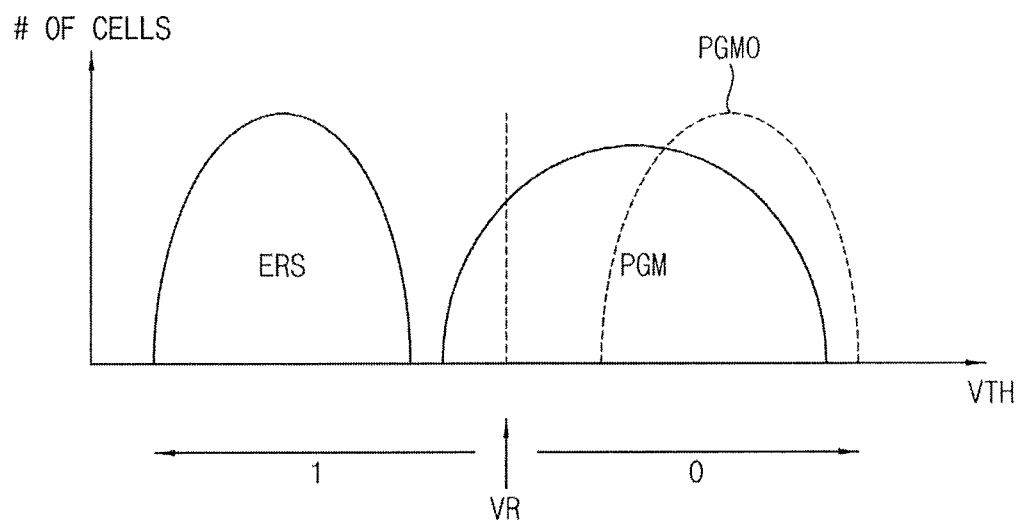
FIGS. 3A to 3D illustrate additional embodiments of combined ECC decoding.

FIGS. 3A to 3D illustrate another embodiment for performing combined ECC decoding based on AND data. FIG. 3A illustrates an example of degeneration of NAND cells where an original programmed state PGM0 is changed to a degenerated programmed state PGM. The charges stored in the memory cell decreases due to a leakage current along elapse of time. This results in a degeneration characteristic where the programmed state PGM moves to the left side, e.g., the direction to decrease the threshold voltage VTH.

Figure 3B:
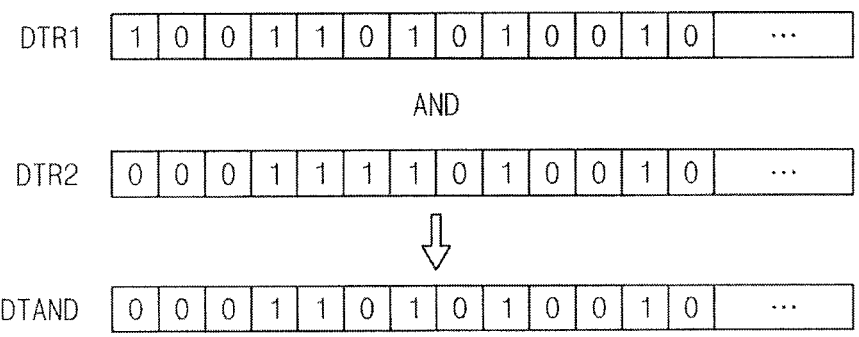

FIG. 3B corresponds to a case that 0 is read out wrongly as 1. In this case, the fail bit number may be reduced using an AND operation of the plurality of read data. As illustrated in FIG. 3A, AND data DTAND may be provided by performing a bit-by-bit AND operation of the first read data DTR1 and the second read data DTR2.

Figures 3C, 3D:
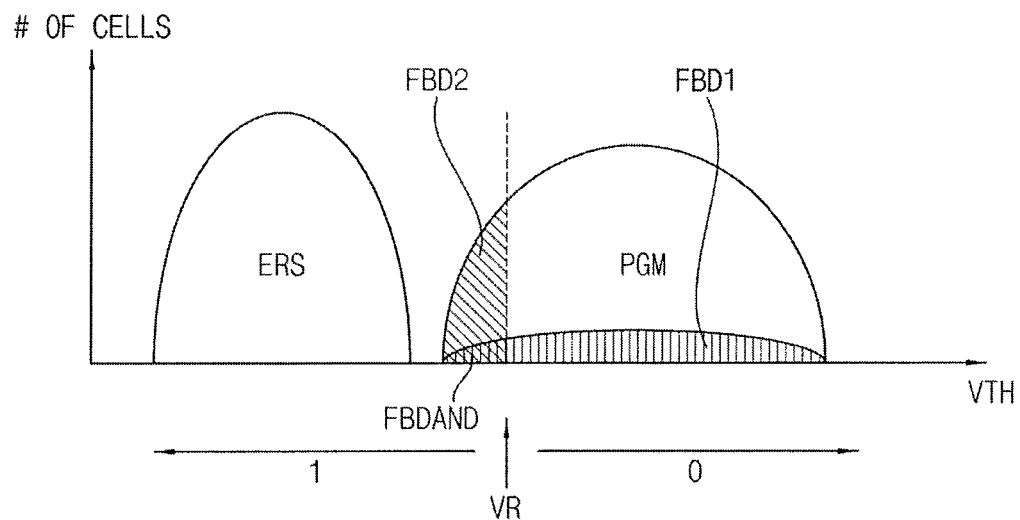

FIG. 3C illustrates, with respect to the memory cells corresponding to the programmed state PGM, the fail bits FBD1 of the first read data DTR1 and the fail bits FBD2 of the second read data DTR2. These fail bits are represented as hatched areas. The memory cells in the programmed state have to be read out as 0, but the memory cells having the threshold voltage VTH lower than the read voltage VR are read out wrongly as 1. This read error may be referred to as 1-error.

The bits of the first read data DTR1 corresponding to the 1-error fail bits FBD2 of the second read data DTR2 may be distributed uniformly in the threshold voltage range of the programmed state PGM. Accordingly the fail bits FBDAND corresponding to the 1-error in both of the first read data DTR1 and the second read data DTR2 may be reduced significantly. For example, the 1-error fail bits FBDAND of the AND data DTAND may be reduced significantly in comparison with each of the 1-error fail bits FBD1 of the first read data DTR1 and the 1-error fail bits FBD2 of the second read data DTR2.

FIG. 3D illustrates a reduction of the 1-error fail bits through the AND operation of the first read data DTR1 and the second read data DTR2. As an example, it is assumed that each ratio of the 1-error fail bits of the first read data DTR1 and the second read data DTR2 is 0.1 (e.g., 10%). In this case, with respect to the result of the AND operation, the ratio of 0-0 case is 0.81, the ratio of 0-1 or 1-0 case is 0.09 and the ratio of 1-1 case is 0.01. Thus the 99% bits of the AND data DTAND are 0 normally and only the 1% bits of the AND data DTAND corresponds to the 1-error fail bits.

For example, assuming the error rate of 1% of the AND data DTAND, each of the first read data DTR1 and the second read data DTR2 may allow the error rate of 10%. As a result, in case of degeneration characteristics of FIG. 3A, the probability of pass or success of error correction may be increased using the combined ECC decoding based on the AND data DTAND.

Figure 4:
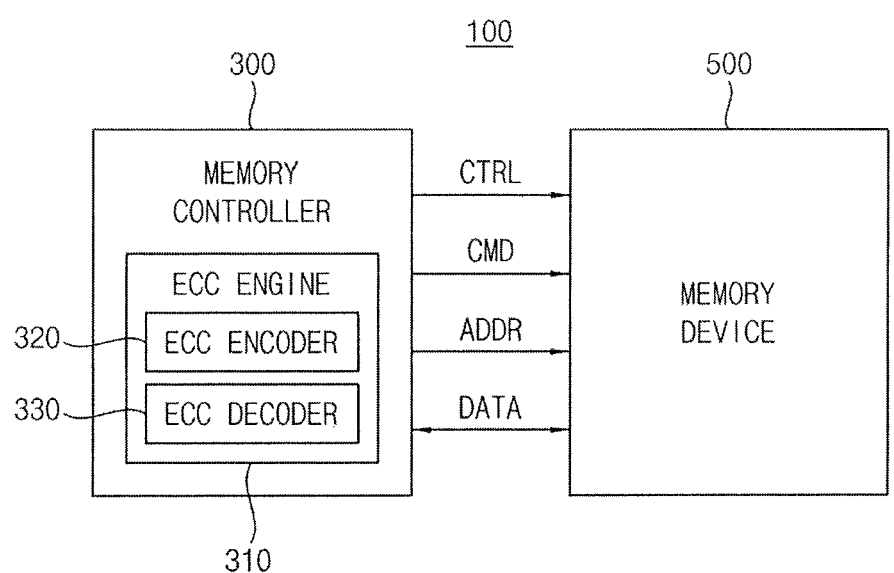
FIG. 4 illustrates an embodiment of a memory system.

FIG. 4 illustrates an embodiment of a memory system 100 which may include a memory controller 300 and at least one memory device 500. The memory device 500 may perform read, write, and erase operations under control of the memory controller 300. The memory device 500 may receive control signals CTRL, commands CMD, addresses ADDR and write data DATA from the memory controller 300 and transmit read data DATA to the memory controller 300.

The memory controller 300 may include an ECC engine 310, that may include an ECC encoder 320 and an ECC decoder 330 to check and correct error bits or fail bits. The ECC engine 310 may perform an ECC operation on data units of the ECC sectors. For example, the data unit of a page may be 8 KB though 64 KB and the data unit of the ECC sector may be 1 KB through 4 KB.

The ECC encoder 320 may perform error correction encoding of the data to be provided to the memory device 500 in order to generate a codeword including parity bits. The codeword may be transferred to and stored in a plurality of storing regions of the memory device 500. The ECC encoder 320 may perform the encoding by data units of ECC sectors. The ECC decoder 330 may perform error correction decoding of the data read out from the memory device 500 and determine fail or success of the error correction decoding. The ECC decoder 330 may correct the error bits of the data using the parity bits in the codeword. If the error bit number exceeds the threshold number or the correctable bit number, the ECC decoder 330 may not correct the error bits and the error correction may not be possible. According to example embodiments, the ECC decoder 330 may provide logic operation data by performing a logic operation of a plurality of read data that are read out from the plurality of storing regions and may perform a combined ECC decoding based on the logic operation data.

As non-limiting examples, the ECC encoder 320 and the ECC decoder 330 may check and correct bit errors using coded modulations such as low density parity check (LDPC) code, Bose, Chaudhuri, Hocquenghem (BCH) code, turbo code, Reed-Solomon code (RSC), convolution code, recursive systematic code, trellis-coded modulation (TCM), block coded modulation (BCM), etc.

Figure 5:
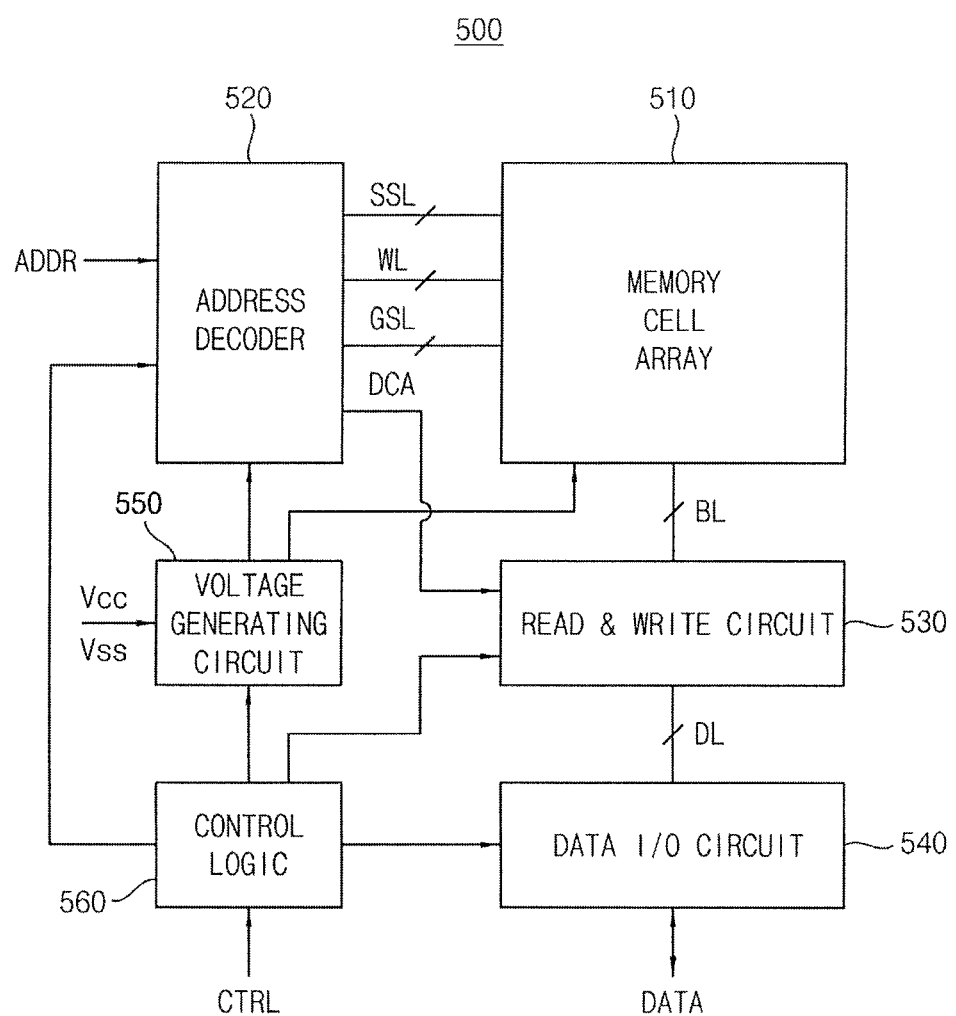
FIG. 5 illustrates an embodiment of a memory device.

FIG. 5 illustrates an example embodiment of a memory device 500, which, for example, may be in the memory system of FIG. 4. Referring to FIG. 5, the memory device 500 includes a memory cell array 510, an address decoder 520, a read-write circuit 530, a data input/output (I/O) circuit 540, a voltage generating circuit 550, and a control logic 560.

The memory cell array 510 is connected to the address decoder 520 through word lines WL and selection lines. For example, the selection lines may include string selection lines SSL and ground selection lines GSL. The memory cell array 510 is connected to the read-write circuit 530 through bit lines BL.

Figure 10:
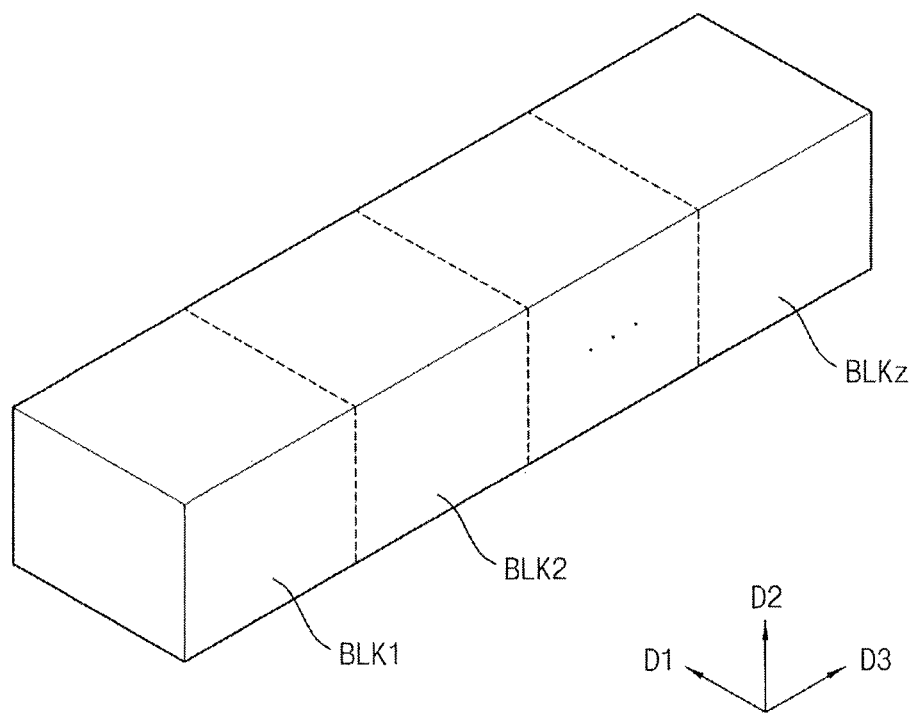
FIG. 10 illustrates an embodiment of a memory cell array.
Figure 11:
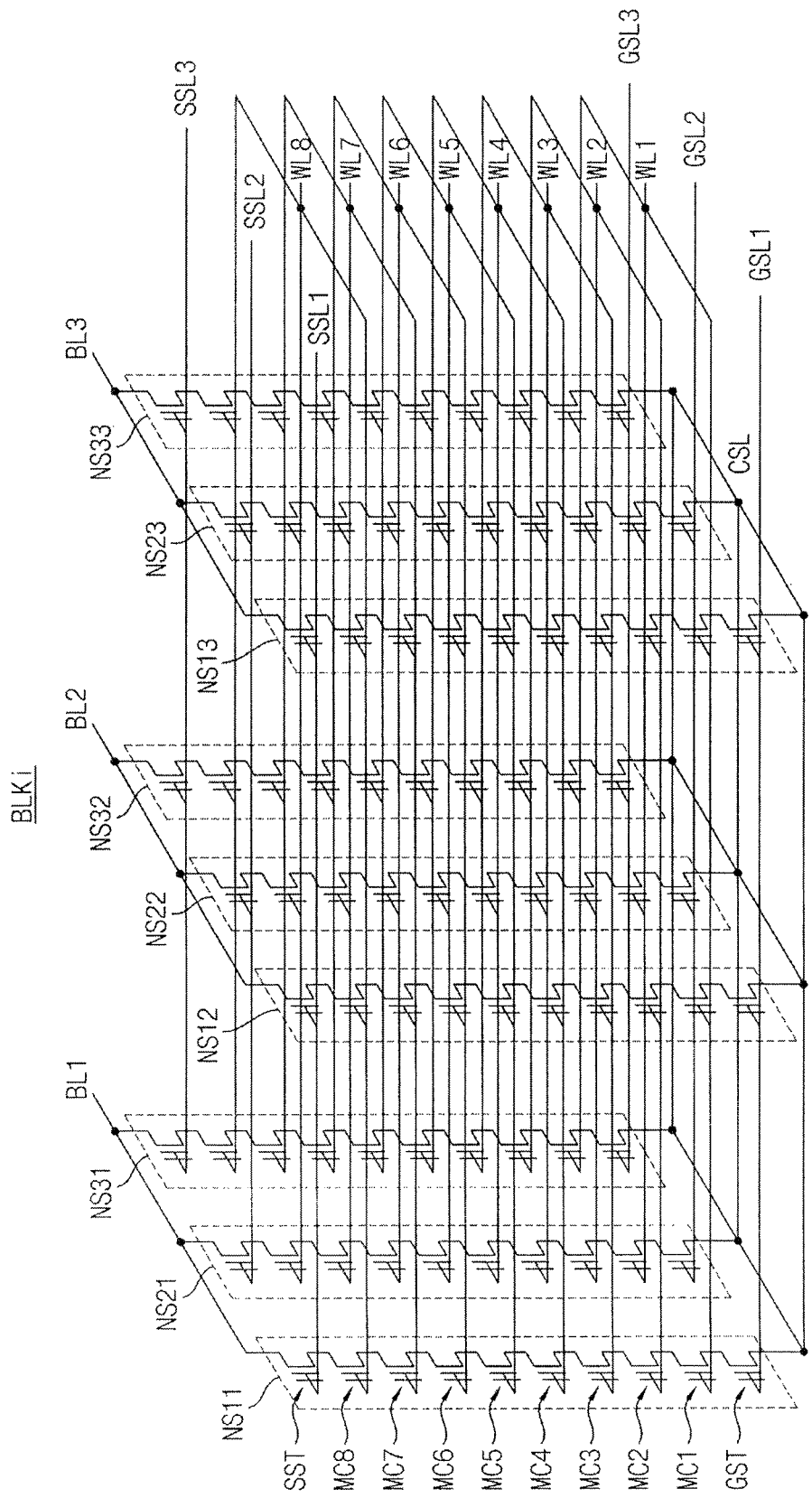
FIG. 11 illustrates an embodiment of a memory block.

The memory cell array 510 may include a plurality of memory cells. For example, the memory cell array 510 includes memory cells in row and column directions. For example, the memory cell array 510 includes a plurality of memory cells, where each cell stores one or more data bits. The memory cell array may have, for example, a vertical NAND flash structure as illustrated in FIGS. 10 and 11.

The address decoder 520 is connected to the memory cell array 510 through word lines WL, string selection lines SSL, and ground selection lines GSL. The address decoder 520 may operate based on one or more control signals from the control logic 560. The address decoder 520 receives addresses ADDR from an external device such as a memory controller.

The address decoder 520 may decode a row address among the received addresses ADDR. The address decoder 520 may select a word line corresponding to the decoded row address among the word lines WL. The address decoder 520 may select selection lines corresponding to the decoded row address among the selection lines including string selection lines SSL and ground selection lines GSL.

The address decoder 520 may deliver various voltages received from the voltage generating circuit 550 to the selected word line, unselected word line, selected selection line, and unselected selection line.

The address decoder 520 may decode a column address among the received address ADDR. The address decoder 520 delivers the decoded column address DCA to the read-write circuit 530. In an example embodiment, the address decoder 520 may include a row decoder decoding a row address, a column decoder decoding a column address, and an address buffer storing a received address ADDR.

The read-write circuit 530 is connected to the memory cell array 510 through bit lines BL and is connected to the data I/O circuit 540 through data lines DL. The read-write circuit 530 operates based on one or more control signals from the control logic 560. The read-write circuit 530 receives a decoded column address DCA from the address decoder 520. The read-write circuit 530 selects bit lines BL based on the decoded column address DCA.

The read-write circuit 530 receives data from the data I/O circuit 540 and writes received data to the memory cell array 510. The read-write circuit 530 reads data from the memory cell array 510 and delivers the read data to the data I/O circuit 540. In an example embodiment, the read-write circuit 530 may include a page buffer (or page register) and a column selection circuit. In an example embodiment, the read-write circuit 530 may further include a sense amplifier, a write driver, and a column selection circuit.

The data I/O circuit 540 is connected to the read-write circuit 530 through data lines DL. The data I/O circuit 140 operates based on one or more control signals from the control logic 560. The data I/O circuit 540 is configured to exchange data DATA with the external. The data I/O circuit 540 is configured to deliver data DATA from the external to the read-write circuit 530 through data lines DL. The data I/O circuit 540 may output data DATA delivered from the read-write circuit 530 through data lines DL to the external. In an example embodiment, the data I/O circuit 540 may include a data buffer.

The voltage generating circuit 550 is connected to the memory cell array 510, the address decoder 520, and the control logic 560. The voltage generating circuit 550 receives power from the external. In an example embodiment, the voltage generating circuit 550 receives a power voltage Vcc and a ground voltage Vss from the external. Based on one or more control signals from the control logic 560, the voltage generating circuit 550 may generate voltages having various voltage levels from the power voltage Vcc and the ground voltage Vss. In an example embodiment, the voltage generating circuit 550 may generate various voltages, e.g., a high voltage VPP, a program voltage Vpgm, a pass voltage Vpass, a read voltage Vread, and/or an erase voltage Vers.

Voltages generated by the voltage generating circuit 550 are supplied to the address decoder 520 and the memory cell array 510 under a control of the control logic 560. For example, a program voltage Vpgm and a pass voltage Vpass may be supplied to the address decoder 520 during a program operation. During a read operation, a read voltage Vread may be supplied to the address decoder 520. During erasing the memory cell array 510, an erase voltage Vers may be supplied to the memory cell array 510. Voltages generated by the voltage generating circuit 550 may be different in other embodiments.

The control logic 560 is connected to the address decoder 520, the read-write circuit 530, the pass/fail check circuit, and the data I/O circuit 540. The control logic 560 may control general operations of the nonvolatile memory device 100a. The control logic 560 may operate based on a control signal CTRL from an external device.

Figure 6:
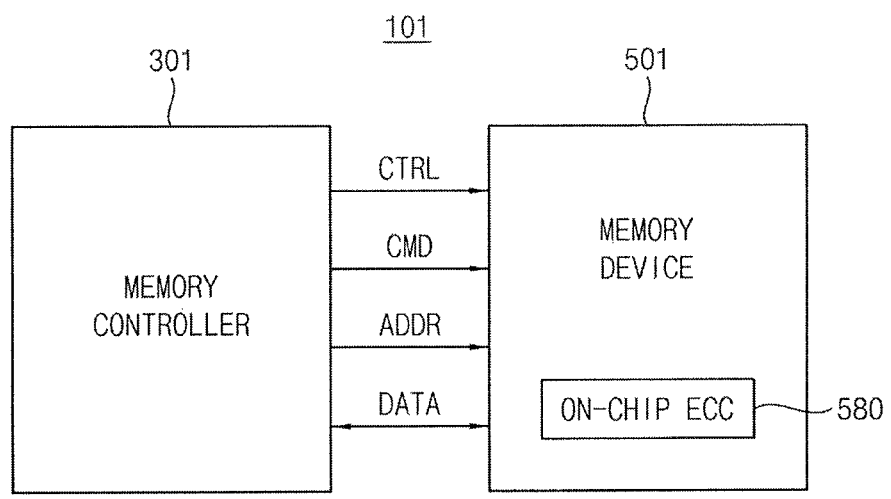
FIG. 6 illustrates another embodiment of a memory system.

FIG. 6 illustrates an embodiment of a memory system 101 which may include a memory controller 301 and at least one memory device 501. The memory device 501 may perform read, write and erase operations under control of the memory controller 301. The memory device 501 may receive control signals CTRL, commands CMD, addresses ADDR and write data DATA from the memory controller 301 and transmit read data DATA to the memory controller 301.

The memory device 501 may include an on-chip ECC circuit 580. When the data are written in the memory cell array, the on-chip ECC circuit 580 may encode the data to generate parity bits. For example, the parity bits may be stored in a parity data region in the memory cell array. When the data are read out from the memory cell array, the on-chip ECC circuit 580 may decode the read data and the parity bits to check and correct the bit errors. The on-chip ECC circuit 580 may include an encoder and a decoder for performing such encoding and decoding. According to example embodiments, the decoder in the on-chip ECC circuit 580 may provide logic operation data by performing a logic operation of a plurality of read data that are read out from the plurality of storing regions and perform a combined ECC decoding based on the logic operation data.

Figure 7:
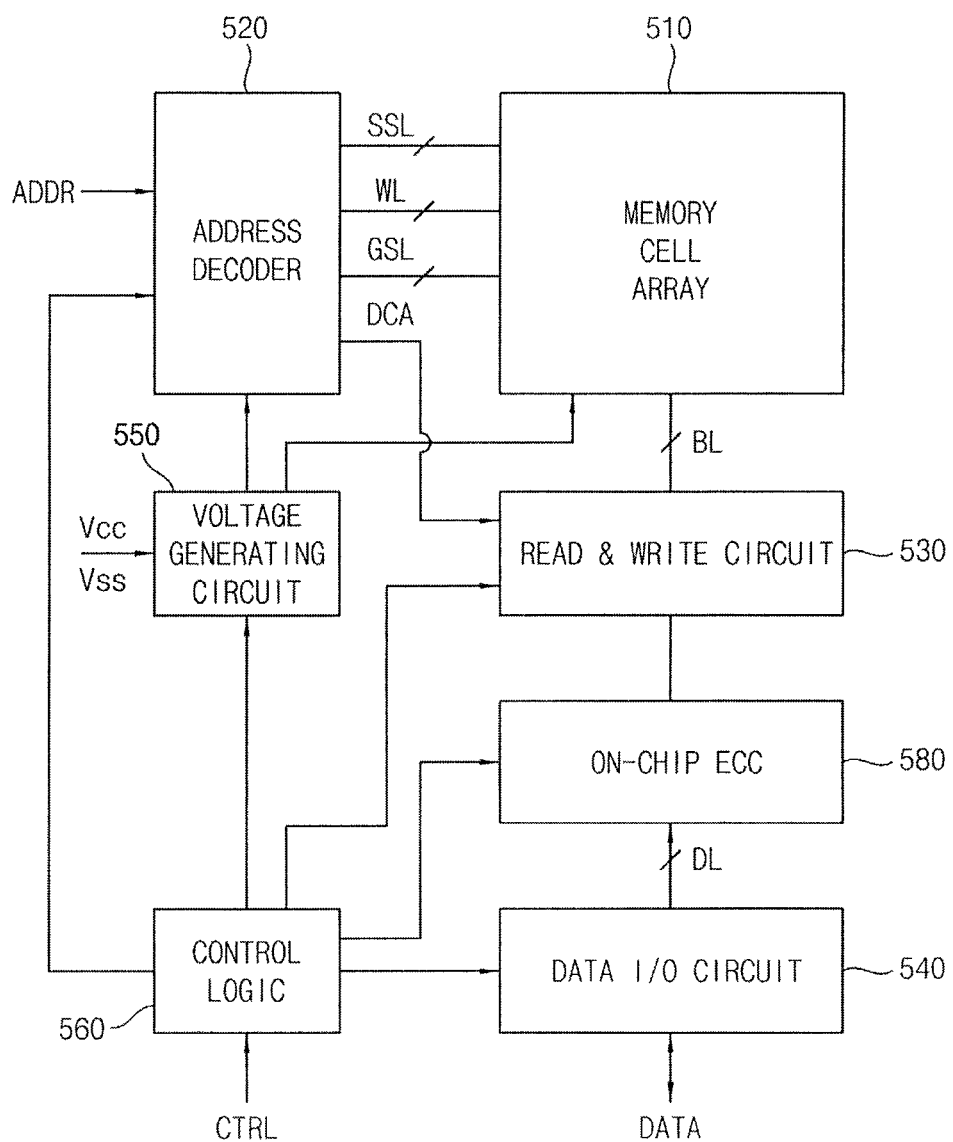
FIG. 7 illustrates another embodiment of a memory device.

FIG. 7 illustrates an example embodiment of a memory device, which, for example, may be included in the memory system of FIG. 6. Referring to FIG. 7, a memory device 501 includes a memory cell array 510, an address decoder 520, a read-write circuit 530, a data input/output (I/O) circuit 540, a voltage generating circuit 550, a control logic 560 and an on-chip ECC circuit 580.

The memory device 501 of FIG. 7 may be substantially the same as the memory device 500 of FIG. 5. Compared with the memory device 500 of FIG. 5, the memory device 501 of FIG. 7 further includes the on-chip ECC circuit 580. The on-chip ECC circuit 580 may be between the read-write circuit 530 and the data input/output circuit 540 and may perform the above-mentioned ECC encoding and ECC decoding.

Figure 8:
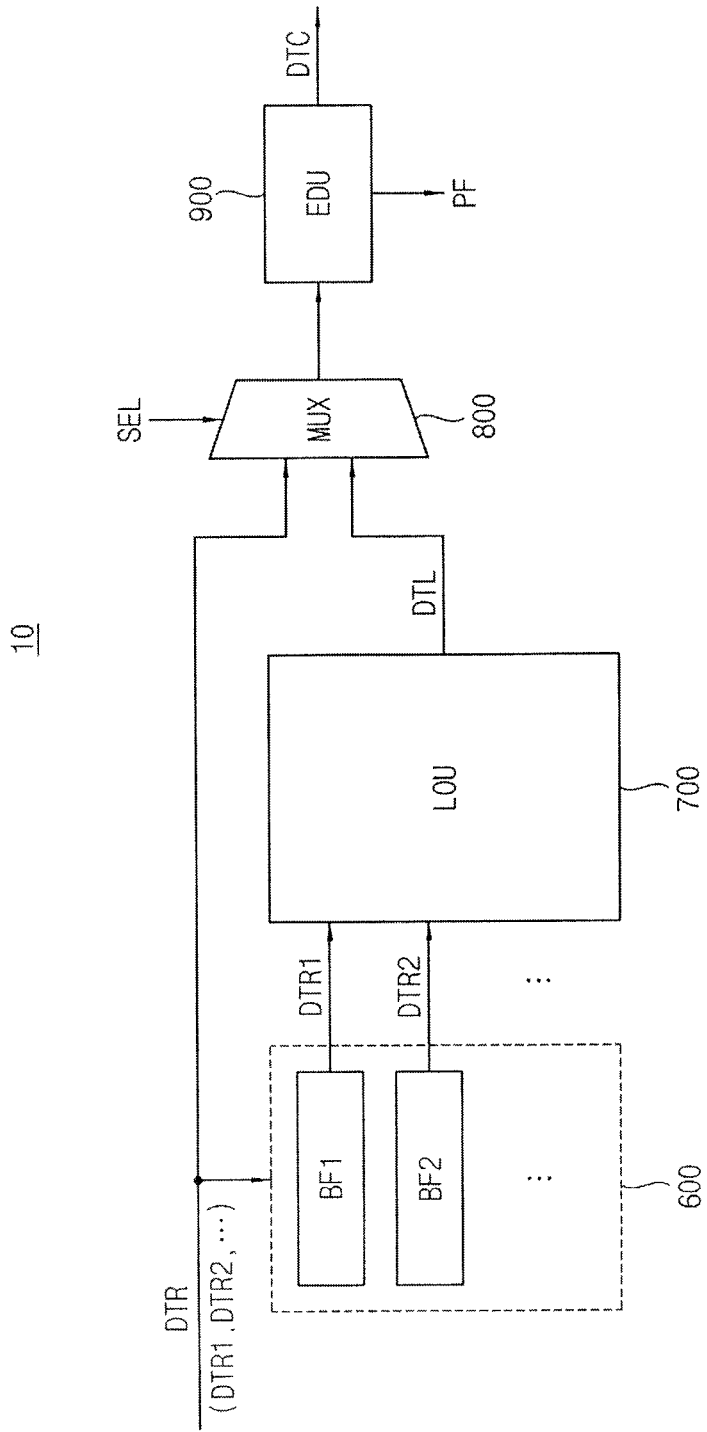
FIG. 8 illustrates an embodiment of an ECC decoder.

FIG. 8 illustrates an embodiment of an ECC decoder 10 which may include a storage unit (or area) 600, a logic operation unit (or logic operator) LOU 700, a selection unit MUX 800 and an ECC decoding unit EDU 900.

The storage unit 600 may include a plurality of buffers BF1 and BF2 to store the plurality of read data DTR1 and DTR2. The logic operation unit 700 may perform a logic operation of the plurality of read data DTR1 and DTR2 to provide logic operation data DTL. The selection unit 800 may select and output one of the plurality of read data DTR1 and DTR2 and the logic operation data DTL. The ECC decoding unit 900 may perform the individual ECC decoding based on each of the plurality of read data DTR1 and DTR2 or the combined ECC decoding based on the logic operation data DTL. The ECC decoding unit 900 may generate a pass-fail signal PF indicating pass of fail of the error correction and provide corrected data when the error correction is successful.

As will be described below with reference to FIGS. 9A and 9B, the logic operation unit 700 may include at least one of an OR operation unit and an AND operation unit. The OR operation unit may provide OR data DTOR by performing a bit-by-bit OR operation of the plurality of read data DTR1 and DTR2. The AND operation unit may provide AND data DTAND by performing a bit-by-bit AND operation of the plurality of read data DTR1 and DTR2.

Figure 9A:
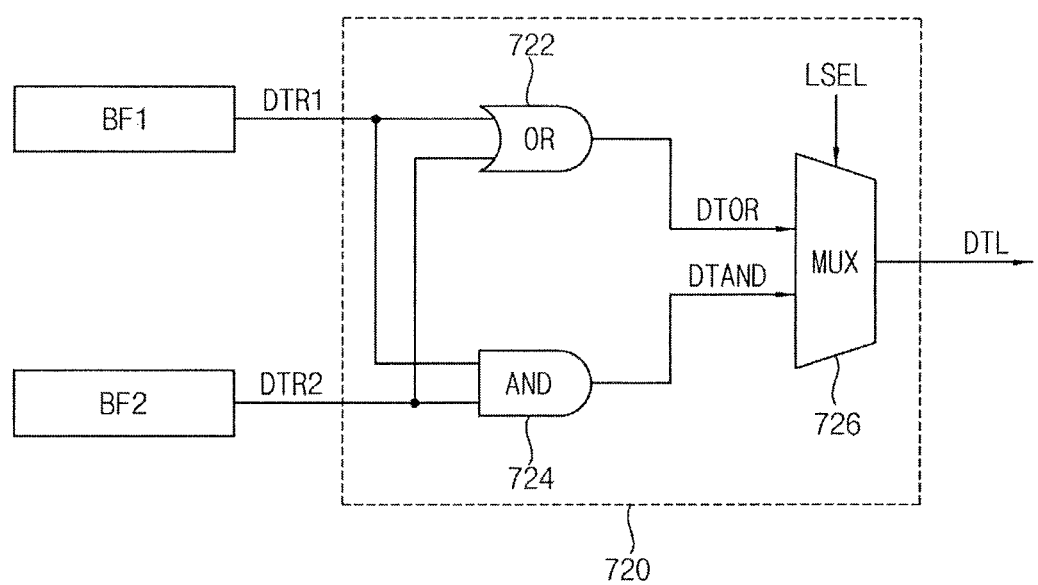
FIGS. 9A and 9B illustrate embodiments of a logic operation unit.
Figure 9B:
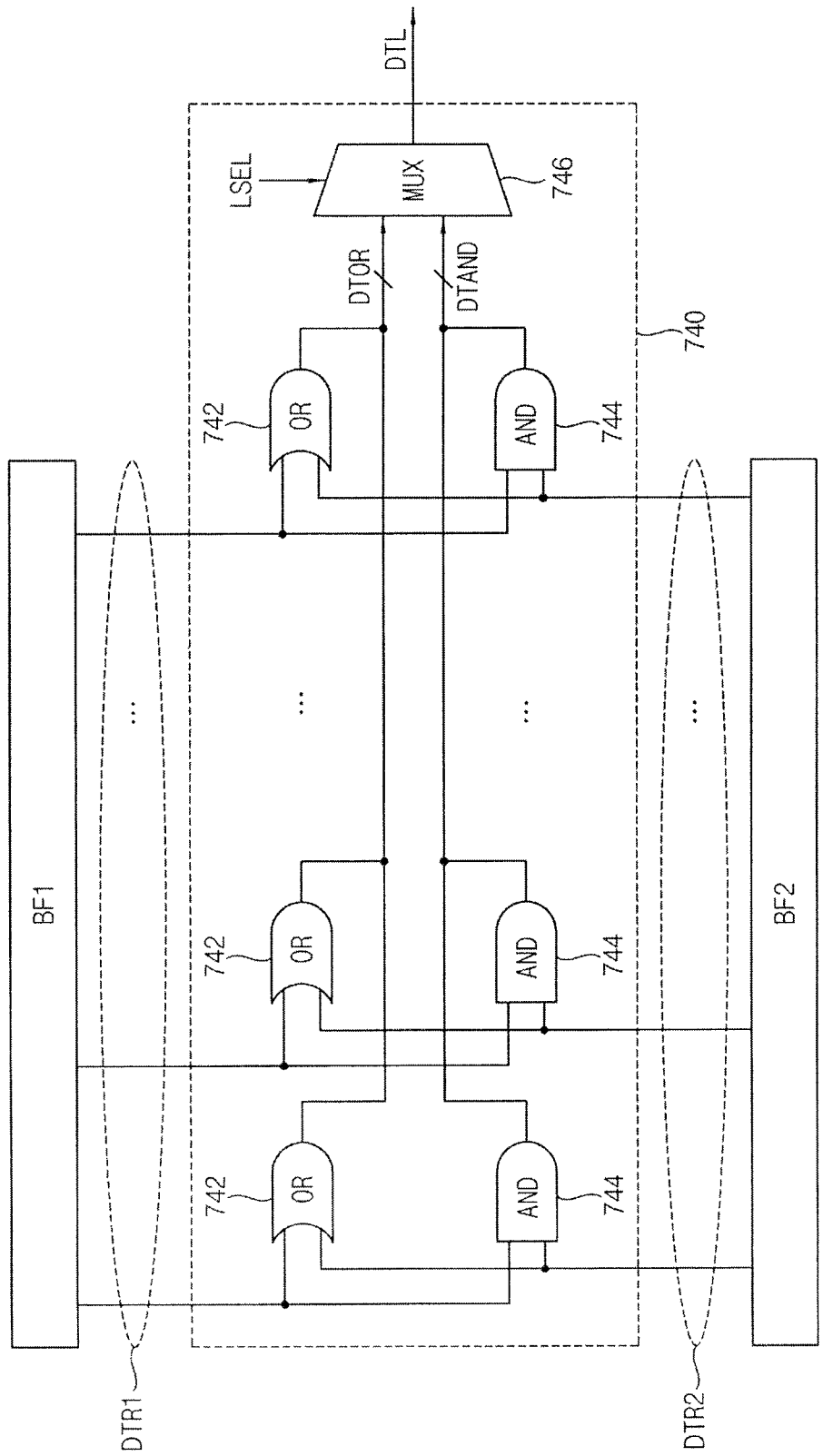

FIGS. 9A and 9B illustrate example embodiments of a logic operation unit, which, for example, may be included in the ECC decoder of FIG. 8. Referring to FIG. 9A, a logic operation unit 720 may include an OR logic gate 722, an AND logic gate 724 and a selector MUX 726. The buffers BF1 and BF2 in the storage unit 600 in FIG. 8 may provide the first read data DTR1 and the second read data DTR2 as serial signals, e.g., as bit streams. The OR logic gate 722 may provide the OR data DTOR as a serial signal by performing the OR operation on the serially-provided bit pairs of the first and second read data DTR1 and DTR2. The AND logic gate 724 may provide the AND data DTAND as a serial signal by performing the AND operation on the serially-provided bit pairs of the first and second read data DTR1 and DTR2. The selector 726 may select one of the OR data DTOR and the AND data DTAND based on a selection signal LSEL and provide the selected one as the logic operation data DTL.

Referring to FIG. 9B, a logic operation unit 740 may include OR logic gates 742, AND logic gates 744 and a selector MUX 746. The buffers BF1 and BF2 in the storage unit 600 in FIG. 8 may provide the first read data DTR1 and the second read data DTR2 as parallel. The OR logic gates 742 may provide the OR data DTOR as a parallel signal by performing the OR operation on the parallel bit pairs of the first and second read data DTR1 and DTR2. The AND logic gates 744 may provide the AND data DTAND as a parallel signal by performing the AND operation on the parallel bit pairs of the first and second read data DTR1 and DTR2. The selector 746 may select one of the OR data DTOR and the AND data DTAND based on a selection signal LSEL and provide the selected one as the logic operation data DTL.

FIG. 10 illustrates an embodiment of the memory cell array 510 in FIG. 5, and FIG. 11 illustrating an equivalent circuit embodiment of a memory block in FIG. 10.

Referring to FIG. 10, the memory cell array 510 may include a plurality of memory blocks BLK1 to BLKz. In an example embodiment, the memory blocks BLK1 to BLKz may be selected by the address decoder 520 in FIG. 5. For example, the address decoder 520 may select a particular memory block BLK corresponding to a block address among the memory blocks BLK1 to BLKz.

The memory block BLKi of FIG. 11 may be formed on a substrate in a three-dimensional structure (or vertical structure). For example, a plurality of memory cell strings in the memory block BLKi may be in a direction crossing or perpendicular to the substrate.

Referring to FIG. 11, the memory block BLKi may include memory cell strings NS11 to NS33 coupled between bit-lines BL1, BL2 and BL3 and a common source line CSL. Each of the memory cell strings NS11 to NS33 may include a string selection transistor SST, a plurality of memory cells MC1 to MC8, and a ground selection transistor GST. In FIG. 11, each of the memory cell strings NS11 to NS33 is illustrated to include eight memory cells MC1 to MC8. In some example embodiments, each of the memory cell strings NS11 to NS33 may include a different number of memory cells.

The string selection transistor SST may be connected to corresponding string selection lines SSL1 to SSL3. The plurality of memory cells MC1 to MC8 may be connected to corresponding word-lines WL1 to WL8, respectively. The ground selection transistor GST may be connected to corresponding ground selection lines GSL1 to GSL3. The string selection transistor SST may be connected to corresponding bit-lines BL1, BL2 and BL3, and the ground selection transistor GST may be connected to the common source line CSL.

Word-lines (e.g., WL1) having the same height may be commonly connected, and the ground selection lines GSL1 to GSL3 and the string selection lines SSL1 to SSL3 may be separated. In FIG. 11, the memory block BLKi is illustrated to be coupled to eight word-lines WL1 to WL8 and three bit-lines BL1 to BL3. In some example embodiments, the memory cell array 510 may be coupled to a different number of word-lines and/or bit-lines.

Figure 12A:
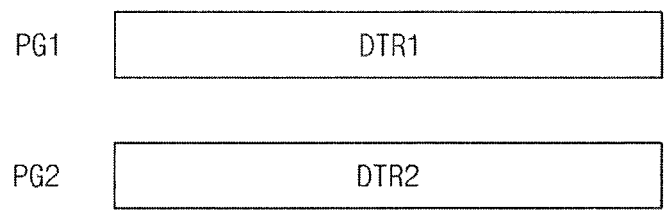
FIGS. 12A and 12B illustrate embodiments for storing write data.
Figure 12B:

FIGS. 12A and 12B illustrate example embodiments for storing write data.

Referring to FIG. 12A, the same write data may be stored in different pages PG1 and PG2 of the non-volatile memory device. Thus, the plurality of read data DTR1 and DTR2 may be read out respectively from the plurality of pages PG1 and PG2. A page may represent a unit of memory cells that may be programmed or read out at the same time. The pages PG1 and PG2 may be in the same memory block or in different memory blocks. In addition, the pages PG1 and PG2 may be in the same semiconductor die or respectively in different semiconductor dies.

Referring to FIG. 12B, the same write data may be stored in different portions of the same page PG of the non-volatile memory device. In this case, the plurality of read data DTR1 and DTR2 may be latched by a latch circuit such as a page buffer by the same read operation because the plurality of read data are in the same page PG. Thus, the ECC decoding time may be reduced.

Figure 13:
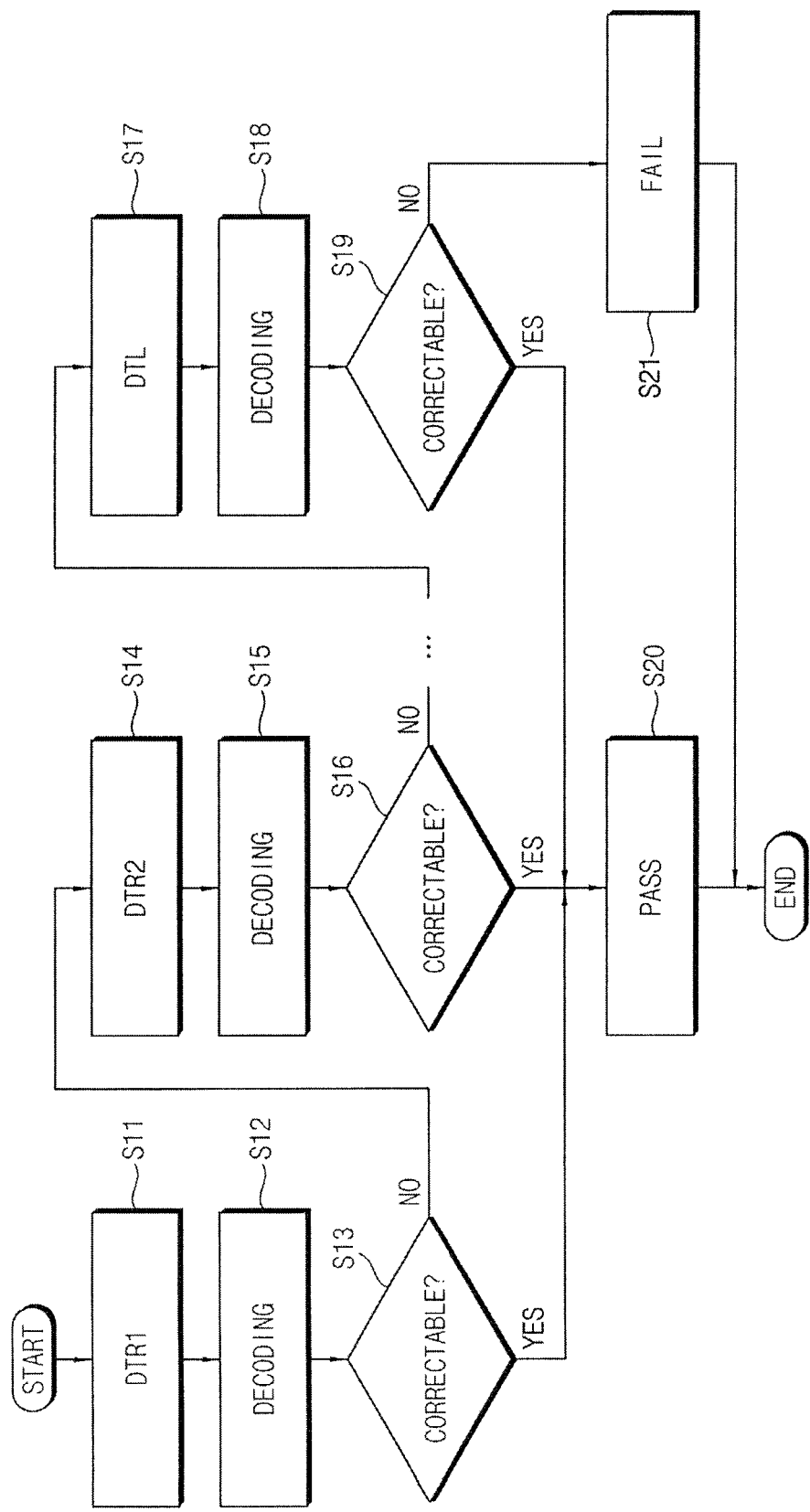
FIG. 13 illustrates another embodiment of a method for controlling ECC of a non-volatile memory device.

FIG. 13 illustrates another embodiment of a method for controlling ECC of a non-volatile memory device. Referring to FIG. 13, the first read data DTR1 are read out among the plurality of read data (S11) and the decoding is performed based on the first read data DTR1 (S12). If the errors are correctable (S13: YES), the decoding is passed (S20) and the decoding is ended.

If the errors are not correctable based on the first read data DTR1 (S13: NO), the second read data DTR2 are read out among the plurality of read data (S14) and the decoding is performed based on the second read data DTR2 (S15). If the errors are correctable (S16: YES), the decoding is passed (S20) and the decoding is ended.

If the errors are not correctable based on the second read data DTR2 (S16: NO), the logic operation data DTL are provided by performing the bit-by-bit logic operation on the first read data DTR1 and the second read data DTR2 (S17). As described above, the logic operation data DTL may include at least one of the OR data DTOR and the AND data DTAND. The combined ECC decoding is performed based on the logic operation data DTL (S18). If the errors are correctable by the combined ECC decoding (S19: YES), the decoding is passed (S20) and the decoding is ended.

If the errors are not correctable by the combined ECC decoding based on the second read data DTR2 (S19: NO), the decoding is failed finally (S21) and the decoding is ended.

As such, the individual ECC decoding may be performed sequentially using each of the plurality of read data DTR1 and DTR2 (S12, S15) until error correction is successful. The combined ECC decoding may be performed if the individual ECC decoding fails with respect to all of the plurality of read data DTR1 and DTR2. Even though FIG. 13 illustrates the first and second read data DTR1 and DTR2 for convenience of illustration and description, the individual ECC decoding may be performed with respect to three or more read data before the combined ECC decoding.

Figures 14, 15:
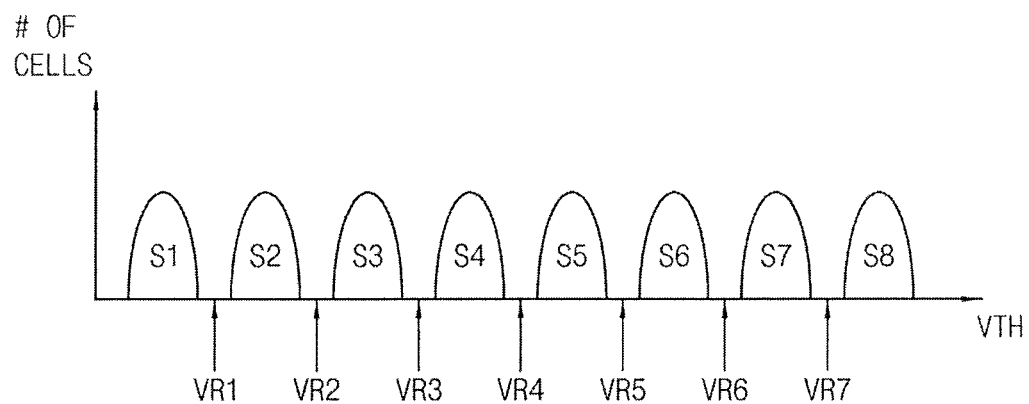
FIGS. 14 to 16 illustrate embodiments of example read sequences.
Figure 16:
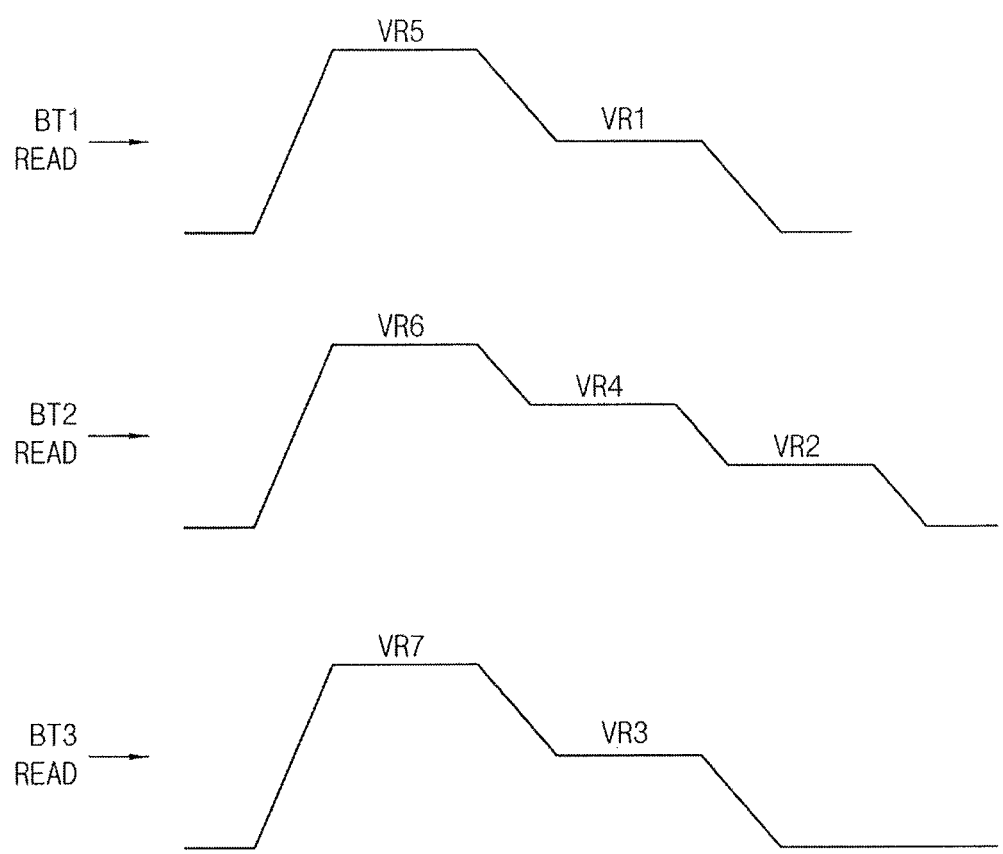

FIGS. 14 to 16 illustrate examples of read sequences for an ECC control method. FIG. 14 illustrates first through eighth states S1~S8 of a triple level cell (TLC), where each TLC stores three data bits. In FIG. 14, the horizontal axis corresponds to a threshold voltage VTH of memory cells and the vertical axis corresponds to the number of the memory cells corresponding to the threshold voltage VTH. The first through eighth states S1~S8 may be distinguished by applying first through seventh read voltage VR1~VR7.

FIG. 15 illustrates an example of bit values corresponding to the first through eighth states S1~S8. The first through eighth states S1~S8 may be represented by 'BT3 BT2 BT1', e.g., different values of first, second, and third bits BT1, BT2, and BT3. For example, as illustrated in FIG. 15, the first state corresponds to '111', the second state corresponds to '110', the third state corresponds to '100', the fourth state corresponds to '000', the fifth state corresponds to '010', the sixth state corresponds to '011', the seventh state corresponds to '001', and the eighth state corresponds to '101'.

The first bit BT1 may be determined using the first read voltage VR1 and the fifth read voltage VR5. The second bit BT2 may be determined using the second read voltage VR2, the fourth read voltage VR4, and the sixth read voltage VR6. The third bit BT3 may be determined using the third read voltage VR3 and the seventh read voltage VR7.

FIG. 16 illustrates an embodiment of a high-to-low read sequence corresponding to the example of FIG. 15. In case of reading the first bit BT1, the fifth read voltage VR5 and the first read voltage VR1 may be applied sequentially to a selected word line. In case of reading the second bit BT2, the sixth read voltage VR6, the fourth read voltage VR4 and the second read voltage VR2 may be applied sequentially to the selected word line. In case of reading the third bit BT3, the seventh read voltage VR7 and the third read voltage VR3 may be applied sequentially to the selected word line.

Hereinafter, example embodiments of a method for controlling ECC of the TLC are described. In one embodiment, the method may be applied to multiple level cell (MLC) storing two bits and four or more bits.

In case of TLC, each memory cell stores three bits and data bits may be distinguished by the states S1~S8. The first state S1 corresponding to the erased state may move to the right direction (e.g., the direction increasing the threshold voltage) and the other states S2~S8 move to the left direction due to the degeneration characteristics of the NAND cells. Also the same write data may be stored in the TLCs of different regions. If the OR operation is performed on the first bit BT1 of the plurality of read data, the state S1 is moved to the left direction and the states S6~S8 are moved to the right direction. In the same way, if the OR operation is performed on the third bit BT3 of the plurality of read data, the states S1~S3 are moved to the left direction and the state S8 are moved to the right direction. In case of the second bit BT2, the values 1 and 0 are not continuous, but the AND operation may be more advantageous because the degeneration of the state S7 may be more serious than the degeneration of the state S2. Thus, the AND operation may be used to move the states S7 and S8 corresponding to 0 to the right direction.

As will be described below with reference to FIG. 8, an error type of the read data may be determined and only one of the combined ECC decoding based on the OR data DTOR and the combined ECC decoding based on the AND data DTAND may be performed.

Figure 17:
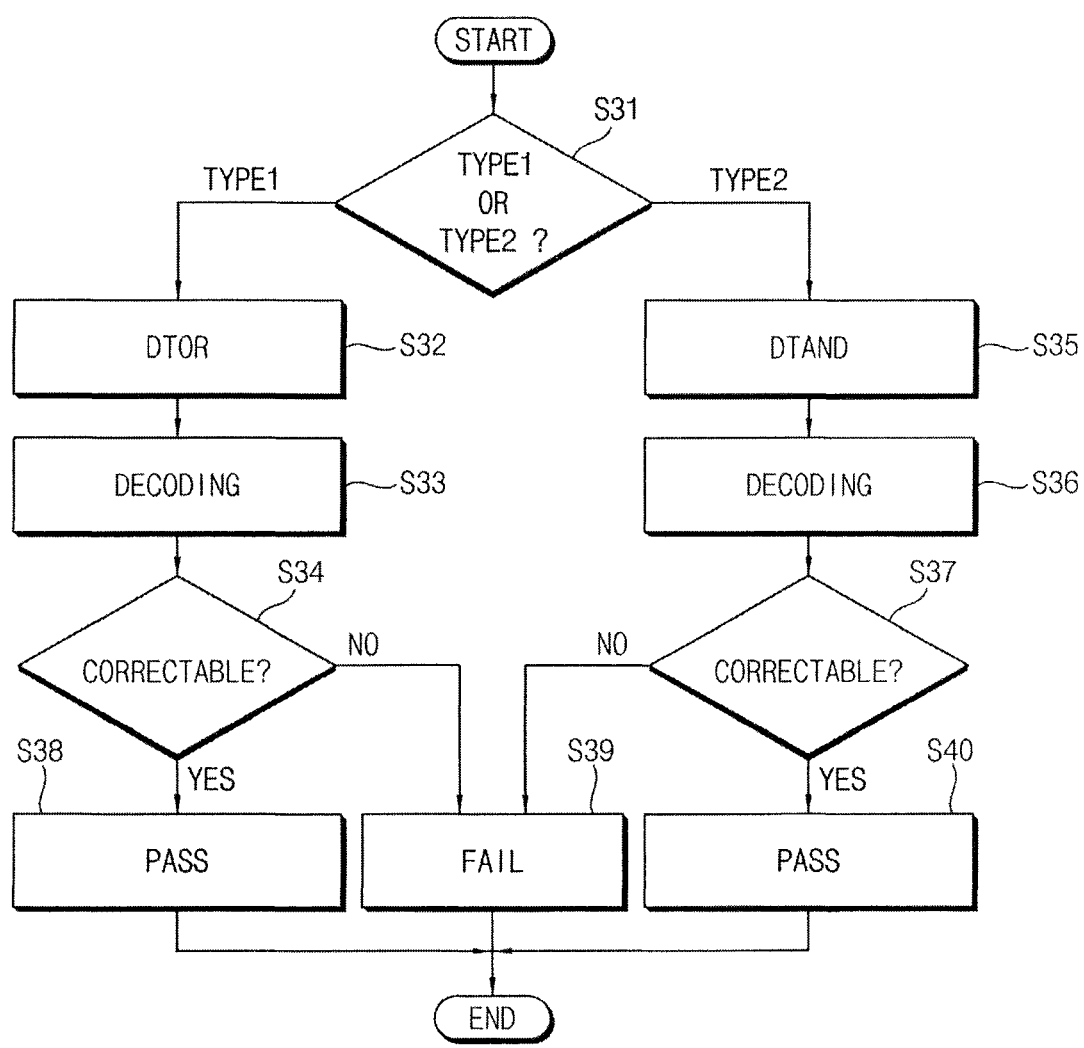
FIG. 17 illustrates another embodiment for combined ECC decoding.

FIG. 17 illustrates an embodiment for performing combined ECC decoding based on error types. An error type of the plurality of read data may be determined among a first error type and a second error type, and the combined ECC decoding may be performed based on the determined error type. The first error type indicates that a ratio of 0-error is greater than a ratio of 1-error. The second error type indicates that the ratio of 1-error is greater than the ration of 0-error. The 0-error indicates a case that a bit value of 1 is read out wrongly to a bit value of 0, and the 1-error indicates a case that the bit value of 0 is read out wrongly to the bit value of 1.

Referring to FIG. 17, when the error type of the read data is the first error type (S31: TYPE1), the OR data DTOR are provided by performing the bit-by-bit OR operation of the read data (S32) and the combined ECC decoding is performed based on the OR data DTOR (S33).

When the errors are correctable by the combined ECC decoding based on the OR data DTOR (S34: YES), the decoding is passed (S38) and the decoding is ended. When the errors are not correctable based on the OR data DTOR (S34: NO), the decoding fails finally (S39) and decoding is ended.

When the error type of the read data is the second error type (S31: TYPE2), the AND data DTAND are provided by performing the bit-by-bit AND operation of the read data (S35) and the combined ECC decoding is performed based on the AND data DTAND (S36).

When the errors are correctable by the combined ECC decoding based on the AND data DTAND (S37: YES), the decoding is passed (S40) and the decoding is ended. When the errors are not correctable based on the AND data DTAND (S37: NO), the decoding fails finally (S39) and decoding is ended.

Figure 18:
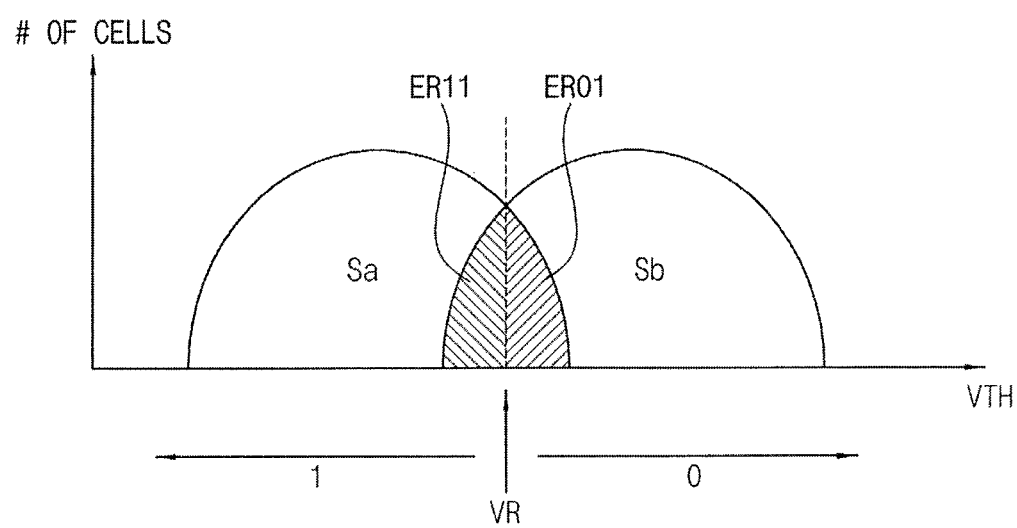
FIG. 18 illustrates an embodiment describing a 0-error ratio and a 1-error ratio.

FIG. 18 illustrates an embodiment describing a 0-error ratio and a 1-error ratio. Referring to FIG. 18, two adjacent states Sa and Sb may be superimposed when degeneration is serious (e.g., corresponding to a predetermined condition) or it is difficult to secure margins between many states of the MLCs. In these cases, a voltage corresponding to a valley between the two states Sa and Sb may be searched through soft decision, hard decision, or another method. The searched voltage may be determined as a default read voltage VR.

Referring to FIG. 18, when the read data are based on the default read voltage VR, the 0-error ratio ER01 and the 1-error ratio ER11 may be represented by the hatched areas, respectively. It is assumed that the 0-error ratio ERO1 is equal to the 1-error ratio ER11.

Figure 19A:
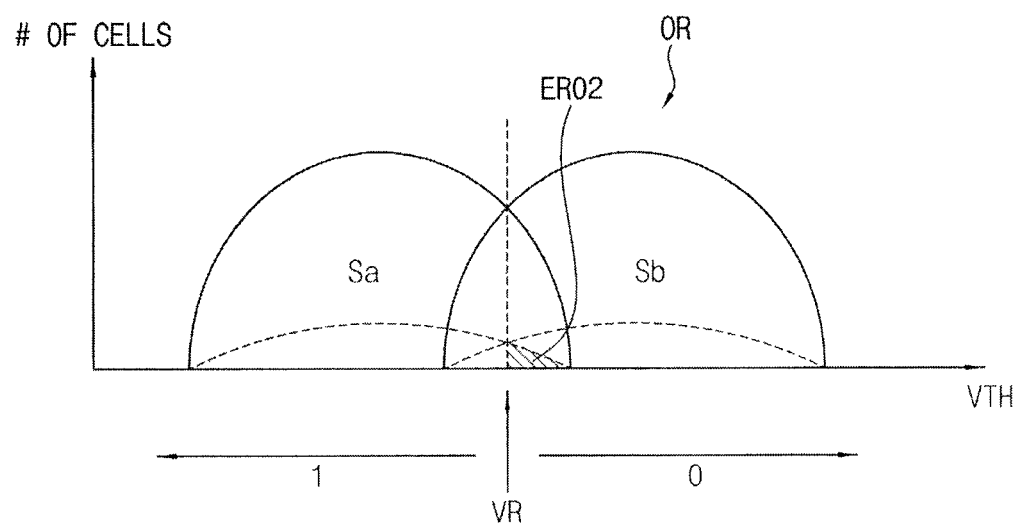
FIGS. 19A, 19B, 20A, and 20B illustrate embodiments for performing a read condition change and combined ECC operation.
Figure 19B:
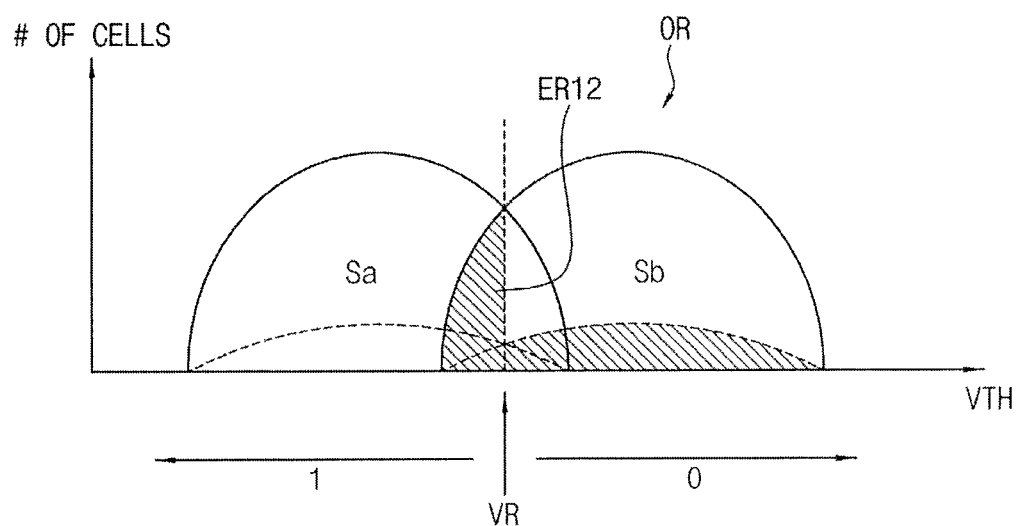

FIGS. 19A, 19B, 20A and 20B illustrate example embodiments of a read condition change and a combined ECC operation. FIGS. 19A and 19B illustrate error ratios when the two read data are read out based on the default read voltage VR and the OR operation is performed on the two read data. As described with reference to FIGS. 2A to 3D, the hatched area in FIG. 19A corresponds to the 0-error ratio ER02 of the OR data and the hatched area in FIG. 19B corresponds to the 1-error ratio ER12 of the OR data.

Figure 20A:
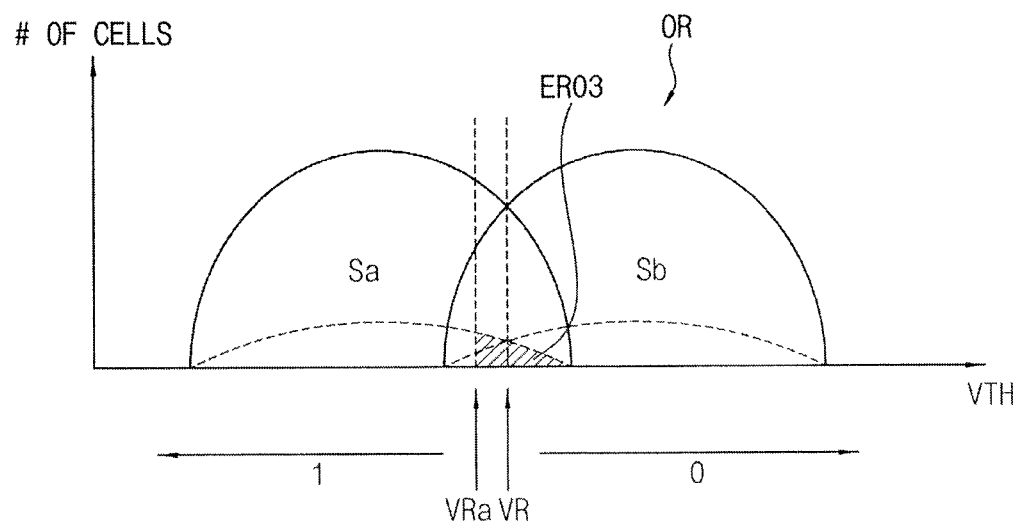
Figure 20B:
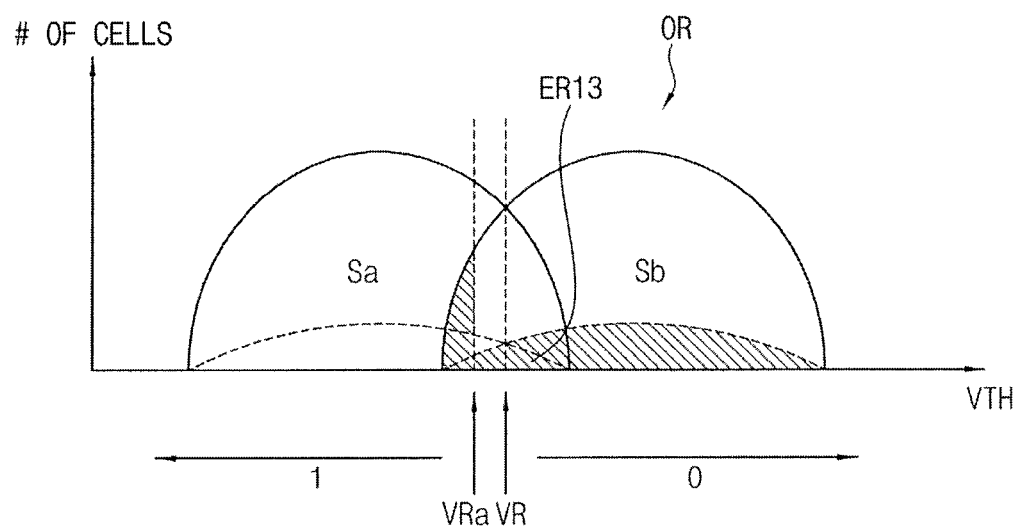

FIGS. 20A and 20B illustrate error ratios when the two read data are read out based on a first correction read voltage VRa that is moved to the left direction from the default read voltage VR and the OR operation is performed on the two read data. As described with reference to FIGS. 2A to 3D, the hatched area in FIG. 20A corresponds to the 0-error ratio ER03 of the OR data and the hatched area in FIG. 20B corresponds to the 1-error ratio ER13 of the OR data.

When the read voltage is changed from the default read voltage VR to the first correction read voltage VRa, the 0-error ratio increases from ER02 of FIG. 19A to ER03 of FIG. 20A but the 1-error ratio further decreases from ER12 of FIG. 19B to ER13 of FIG. 20B. Accordingly the total error ratio ER03+ER13 corresponding to the first correction read voltage VRa may be decreased in comparison with the total error ratio ER02+ER12 corresponding to the default read voltage VR. Thus, when the combined ECC decoding is based on the OR data, it may be advantageous to change the read voltage to the direction increasing the 0-error ratio.

Figure 21A:
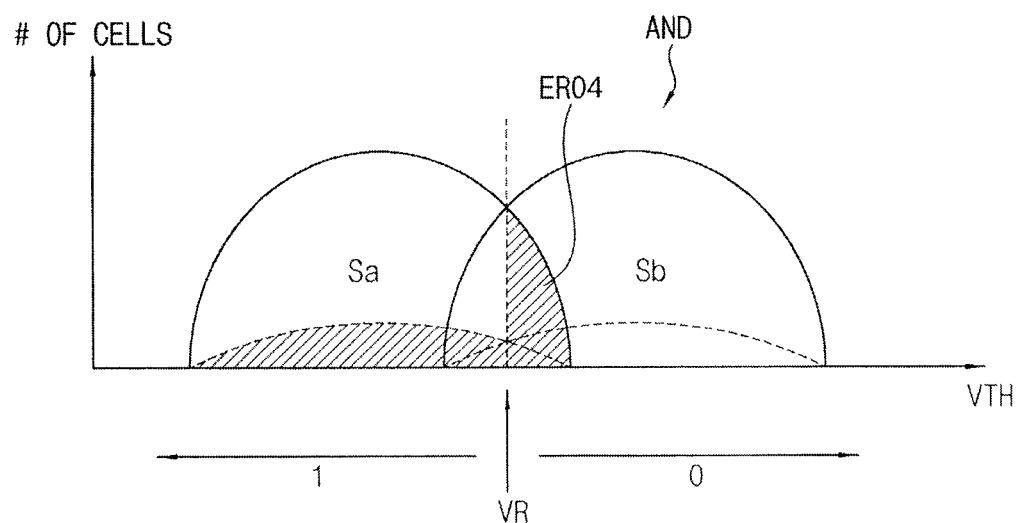
FIGS. 21A, 21B, 22A and 22B illustrate additional embodiments for performing a read condition change and combined ECC operation.
Figure 21B:
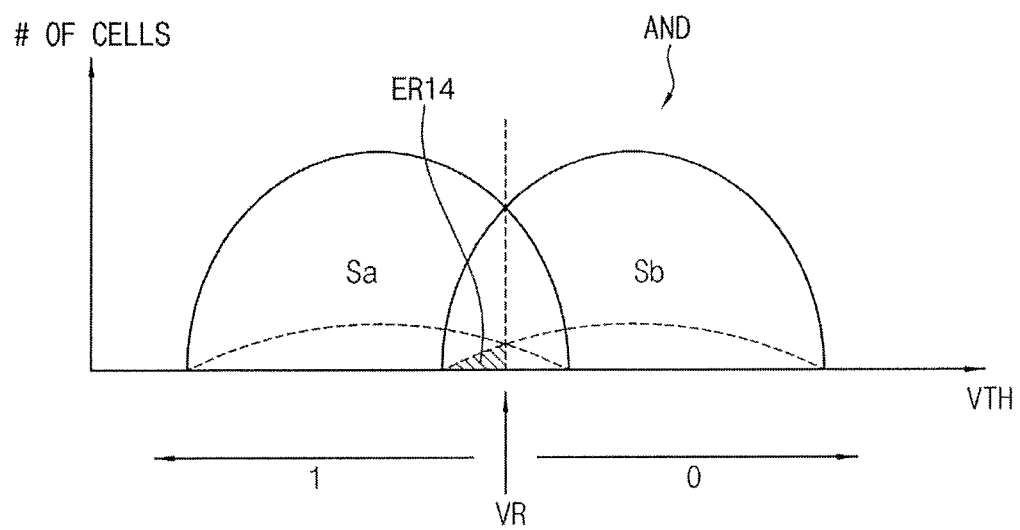

FIGS. 21A, 21B, 22A and 22B illustrate other example embodiments of a read condition change and a combined ECC operation. FIGS. 21A and 21B illustrate error ratios when the two read data are read out based on the default read voltage VR and the AND operation is performed on the two read data. As described with reference to FIGS. 2A to 3D, the hatched area in FIG. 21A corresponds to the 0-error ratio ER04 of the AND data and the hatched area in FIG. 21B corresponds to the 1-error ratio ER14 of the AND data.

Figure 22A:
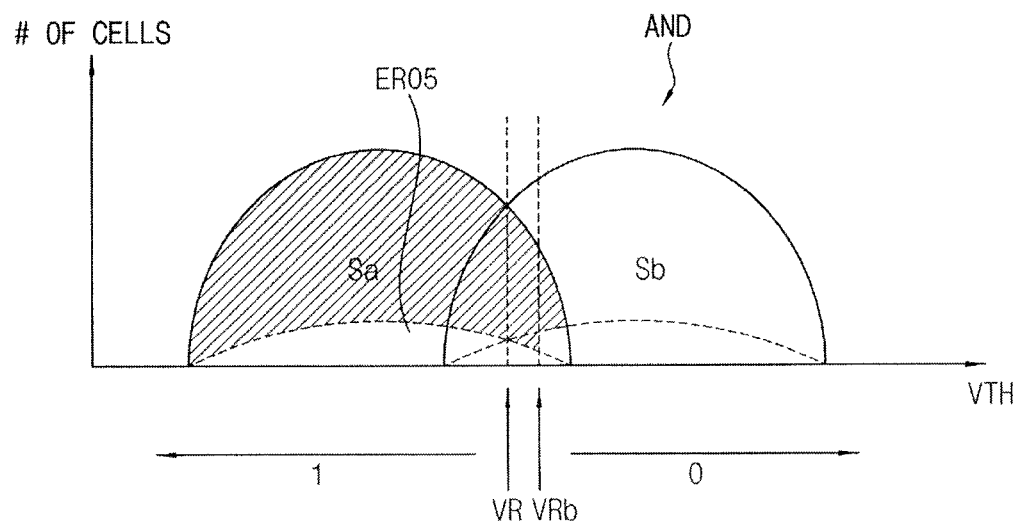
Figure 22B:
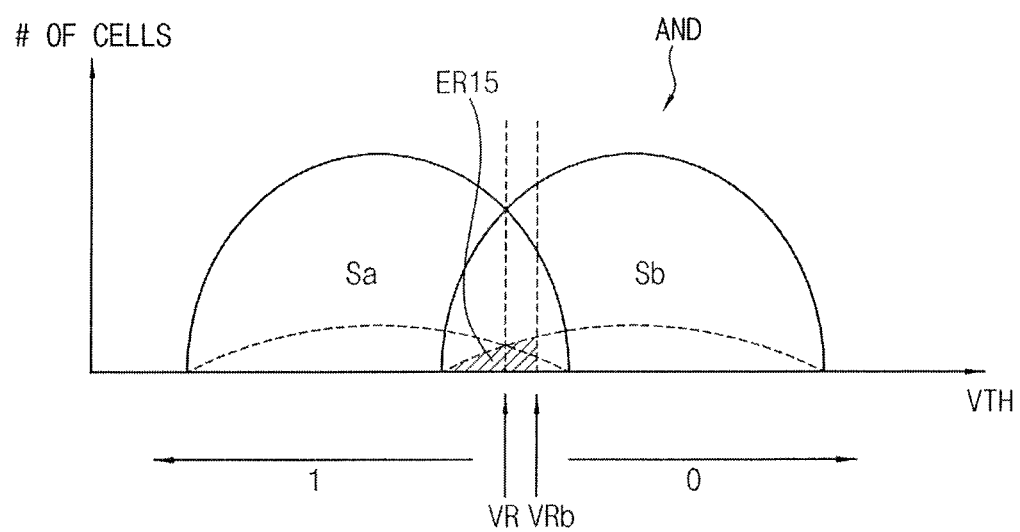

FIGS. 22A and 22B illustrate error ratios when the two read data are read out based on a second correction read voltage VRb that is moved to the right direction from the default read voltage VR and the AND operation is performed on the two read data. As described with reference to FIGS. 2A to 3D, the hatched area in FIG. 22A corresponds to the 0-error ratio ER05 of the AND data and the hatched area in FIG. 22B corresponds to the 1-error ratio ER15 of the AND data.

When the read voltage is changed from the default read voltage VR to the second correction read voltage VRb, the 1-error ratio increases from ER14 of FIG. 21B to ER15 of FIG. 22B but the 0-error ratio further decreases from ER04 of FIG. 21A to ER05 of FIG. 22A. Accordingly the total error ratio ER05+ER15 corresponding to the second correction read voltage VRb may be decreased in comparison with the total error ratio ER04+ER14 corresponding to the default read voltage VR. Thus, when the combined ECC decoding is based on the AND data, it may be advantageous to change the read voltage to the direction increasing the 1-error ratio.

FIG. 23 illustrates an example embodiment of a read condition change and a combined ECC operation. FIG. 23 illustrates the read voltages for reading out the first bit BT1 as described with reference to FIG. 15. If the individual ECC decoding and the combined ECC decoding fail based on the plurality of read data by the default voltages VR1 and VR5, the default read voltages VR1 and VR5 are changed and then the read operation and the combined ECC decoding may be performed. A plurality of correction read data may be read out from the plurality of storing regions based on the changed read voltages or the correction read voltages. Correction logic operation data may be provided by performing a logic operation of the plurality of correction read data and the combined ECC decoding may be performed based on the correction logic operation data.

In some example embodiments, as described with reference to FIGS. 19A, 19B, 20A and 20B, the read voltages may be changed to increase the 0-error ratio when the combined ECC decoding is performed using the OR data. For example, a plurality of first correction read data may be read out from the plurality of storing regions based on the first correction voltage VR1" and VR5" from the default read voltages VR1 and VR5 to increase the 0-error ratio, First correction logic operation data may be provided by performing an OR operation of the plurality of first correction read data. Combined ECC decoding may be then performed based on the first correction logic operation data.

In some example embodiments, as described with reference to FIGS. 21A, 21B, 22A and 22B, the read voltages may be changed to increase the 1-error ratio when the combined ECC decoding is performed using the AND data. For example, a plurality of second correction read data may be read out from the plurality of storing regions based on the second correction voltage VR1' and VR5' from the default read voltages VR1 and VR5 to increase the 1-error ratio. Second correction logic operation data may be provided by performing an AND operation of the plurality of second correction read data, and the combined ECC decoding may be performed based on the second correction logic operation data.

Figure 24:
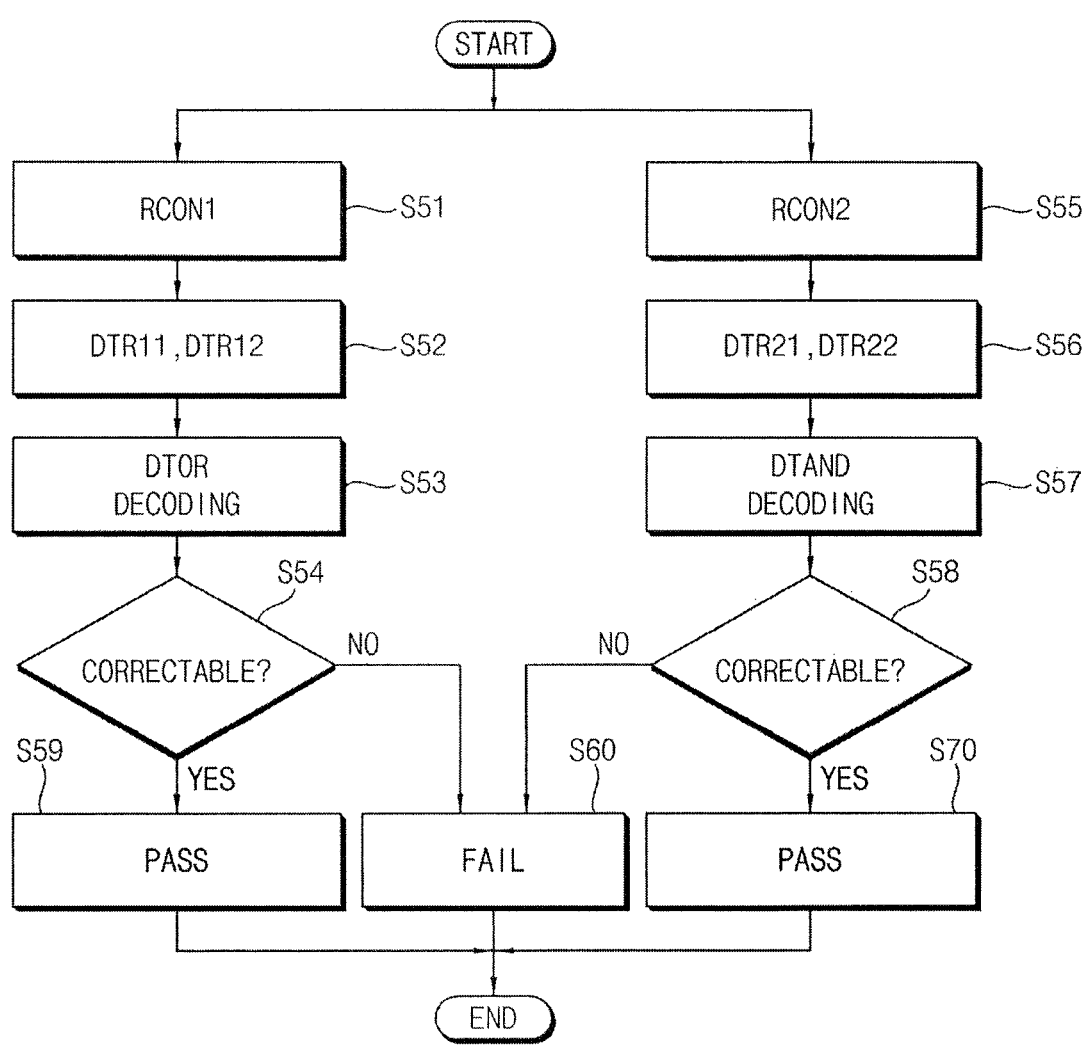
FIG. 24 illustrates another embodiment of a read condition change and a combined ECC operation.

FIG. 24 illustrates an embodiment of a read condition change and a combined ECC operation. Referring to FIG. 24, a first read condition RCON1 is set (S51) and a plurality of read data DTR11 and DTR12 are read out based on the first read condition RCON1 (S52). The first read condition RCON1 may include at least one read voltage that is changed to the direction to increase the 0-error ratio as described with reference to FIGS. 19A, 19B, 20A and 20B.

OR data DTOR are provided by performing a bit-by-bit OR operation of the plurality of read data DTR11 and DTR12 and the combined ECC decoding is performed based on the OR data (S53).

When the errors are correctable by the combined ECC decoding based on the OR data DTOR (S54: YES), decoding is passed (S59) and ended. When the errors are not correctable based on the OR data DTOR (S54: NO), decoding fails finally (S60) and is ended.

Also, a second read condition RCON2 is set (S55) and a plurality of read data DTR21 and DTR22 are read out based on the second read condition RCON2 (S56). The second read condition RCON2 may include at least one read voltage that is changed to the direction to increase the 1-error ratio as described with reference to FIGS. 21A, 21B, 22A and 22B.

AND data DTAND are provided by performing a bit-by-bit AND operation of the plurality of read data DTR21 and DTR22 and the combined ECC decoding is performed based on the AND data (S57).

When the errors are correctable by the combined ECC decoding based on the AND data DTAND (S58: YES), decoding is passed (S70) and is ended. When the errors are not correctable based on the AND data DTAND (S58: NO), decoding fails finally (S60) and is ended.

Figure 25A:
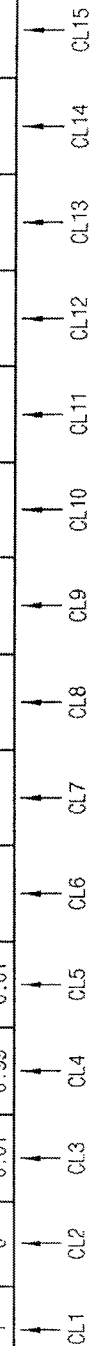

FIGS. 25A and 25B illustrate examples of error ratios of a combined ECC decoding depending on error types. FIG. 25A corresponds to cases when a degeneration degree of first read data DTR1 is equal to a degeneration degree of second read data DTR2. FIG. 25B corresponds to cases when the degeneration degree of first read data DTR1 is different from the degeneration degree of second read data DTR2.

In FIGS. 25A and 25B, each of columns CL1~CL15 represent ratios corresponding to respective cases. "1□1" represents cases when 1 is read out normally as 1. "1□0" represents cases when 1 is read out wrongly as 0. "0□1" represents cases when 0 is read out wrongly as 1. "0□0" represents cases when 0 is read out normally as 0. The column CL5 represents the total error ratio ER1 when the logic operation is not performed (NO LO). The column CL14 represents the total error ratio ER2 when the OR operation is performed. The column CL15 represents the total error ratio ER3 when the AND operation is performed.

Referring to FIG. 25A, when the degeneration degree of first read data DTR1 is equal to the degeneration degree of second read data DTR2, there is no advantage when the 1-error ratio is equal to the 0-error ratio (CASE3). The OR operation is advantageous when the 1-error ratio is increased (CASE1 and CASE2). The AND operation is advantageous when the 0-error ratio is increased (CASE4 and CASE5).

Referring to FIG. 25B, there may be no advantage when each of the 1-error ratio and the 0-error ratio is 100% (CASE4). Improvement of errors may be increased in the order of CASE3, CASE2, and CASE1.

Figure 26:
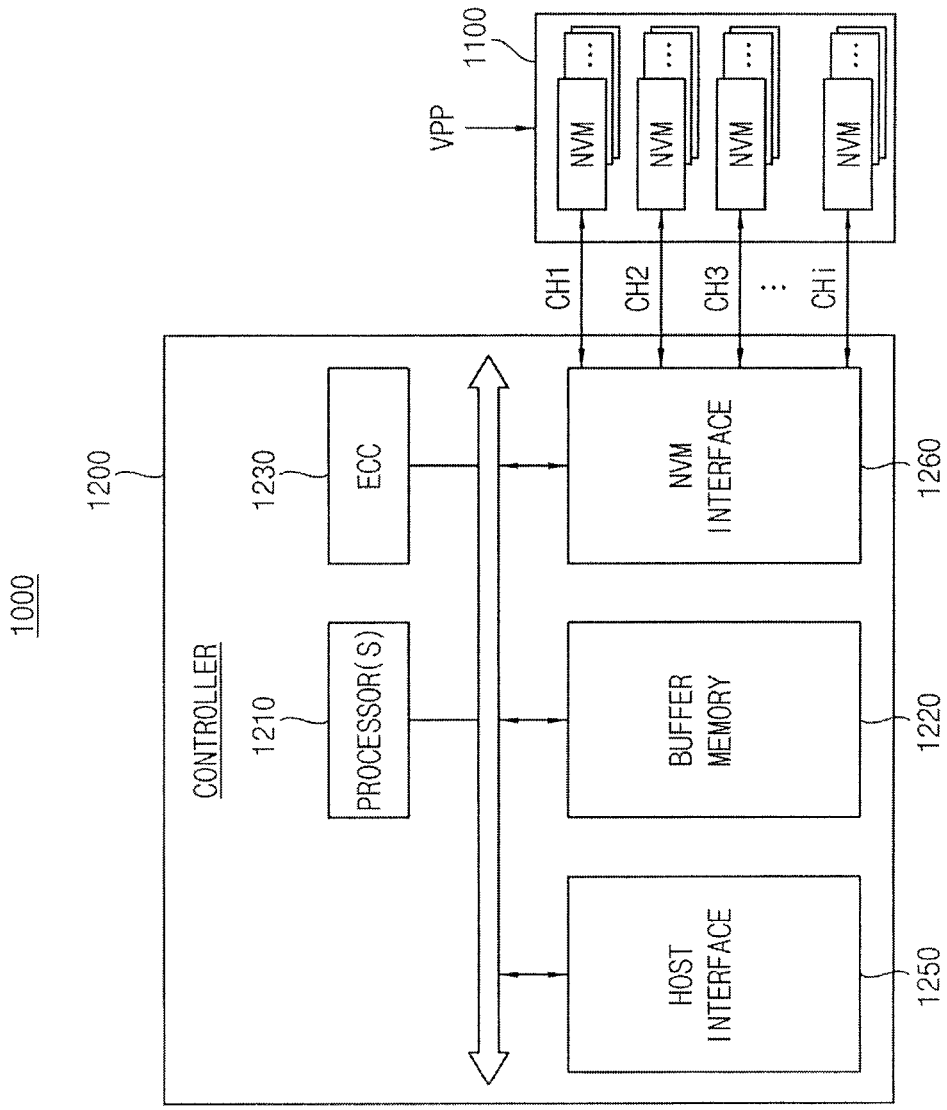
FIG. 26 illustrates an embodiment of a solid state disk or solid state drive (SSD).

FIG. 26 illustrates an embodiment of a solid state disk or solid state drive (SSD). Referring to FIG. 26, SSD 1000 includes multiple nonvolatile memory devices 1100 and an SSD controller 1200. The SSD controller 1200 is connected to the nonvolatile memory devices 1100 through multiple channels CH1 to CHi. The SSD controller 1200 includes one or more processors 1210, a buffer memory 1220, an ECC block 1230, a host interface 1250, and a nonvolatile memory interface 1260.

The buffer memory 1220 stores data used to drive the SSD controller 1200. The buffer memory 1220 comprises multiple memory lines each storing data or a command. The ECC block 1230 calculates error correction code values of data to be programmed at a writing operation and corrects an error of read data using an error correction code value at a read operation. In a data recovery operation, the ECC block 1230 corrects an error of data recovered from the nonvolatile memory devices 1100.

As described above, the nonvolatile memory devices 1100 may store the same write data in a plurality of storage regions and the ECC block 1230 may perform the combined ECC decoding based on the logic operation data of the plurality of read data to increase probability of error correction success. As such, the method of controlling ECC of non-volatile memory device and the memory system performing the method according to example embodiments may correct errors through the combined ECC decoding based on the logic operation data, even though each of the plurality of read data is uncorrectable. As a result, yield, reliability and lifetime of the non-volatile memory device may be enhanced.

Even though the example embodiments are described based on the two read data DTR1 and DTR2, the example embodiment may be modified to the same write data in three or more storage regions and thus the logic operation may be performed on the three or more read data for the combined ECC decoding. In some example embodiments, the OR operation and/or the AND operation may be performed on all of the three or more read data to provide the logic operation data. In other example embodiments, with respect to four or more read data, some read data may be used to provide the OR data and other read data may be used to provide the AND data.

The embodiments disclosed herein may be applied to various devices and systems including, but not limited to, a memory device requiring error check and correction. For example, the embodiments may be applied to systems such as mobile phones, smart phones, personal digital assistants (PDAs), portable multimedia player (PMPs), digital cameras, camcorders, personal computers (PCs), server computers, workstations, laptop computers, digital TVs, set-top boxes, portable game consoles, navigation systems, and other electronic products and systems.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

The controllers, processors, and other signal generating and signal processing features of the embodiments disclosed herein may be implemented in logic which, for example, may include hardware, software, or both. When implemented at least partially in hardware, the controllers, processors, and other signal generating and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, processors, and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

The various operations of methods described above may be performed by any suitable means capable of performing the operations, such as various hardware and/or software component(s), circuits, and/or module(s).

The software may comprise an ordered listing of executable instructions for implementing logical functions, and can be embodied in any "processor-readable medium" for use by or in connection with an instruction execution system, apparatus, or device, such as a single or multiple-core processor or processor-containing system.

The blocks or steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A method for controlling error check and correction (ECC) of a non-volatile memory device, the method comprising:
storing write data in a plurality of storing regions of the non-volatile memory device, the write data generated by performing ECC encoding using an encoder;
performing individual ECC decoding using a decoder based on each of a plurality of read data that are read out from the plurality of storing regions;
providing logic operation data by performing a logic operation of the plurality of read data that are stored in data mirroring using the decoder when the individual ECC decoding fails with respect to all of the plurality of read data; and
performing a combined ECC decoding based on the logic operation data using the decoder.

2. The method as claimed in claim 1, wherein providing the logic operation data includes at least one of:
providing OR data by performing a bit-by-bit OR operation of the plurality of read data; and
providing AND data by performing a bit-by-bit AND operation of the plurality of read data.

3. The method as claimed in claim 2, wherein the combined ECC decoding based on the OR data and the combined ECC decoding based on the AND data are performed regardless of an error type of the plurality of read data.

4. The method as claimed in claim 2, further comprising:
determining whether an error type of the plurality of read data is a first error type or a second error type, the first error type indicating that a ratio of 0-error is greater than a ratio of 1-error, the second error type indicating that the ratio of 1-error is greater than the ratio of 0-error, the 0-error indicating a case that a bit value of 1 is read out wrongly to a bit value of 0, the 1-error indicating a case that the bit value of 0 is read out wrongly to the bit value of 0.

5. The method as claimed in claim 4, wherein only one of the combined ECC decoding based on the OR data and the combined ECC decoding based on the AND data is performed based on a determination of the error type.

6. The method as claimed in claim 5, wherein:
when the error type is determined as the first error type, only the combined ECC decoding based on the OR data is performed.

7. The method as claimed in claim 5, wherein:
when the error type is determined as the second error type, only the combined ECC decoding based on the AND data is performed.

8. The method as claimed in claim 1, further comprising:
changing a read voltage to a correction read voltage when an error correction is determined as being failed by the combined ECC decoding;
reading out a plurality of correction read data from the plurality of storing regions based on the correction read voltage;
providing correction logic operation data by performing a logic operation of the plurality of correction read data; and
performing the combined ECC decoding based on the correction logic operation data.

9. The method as claimed in claim 8, wherein:
the read voltage is changed such that a ratio of 0-error is increased,
the 0-error indicates that a bit value of 1 is read out wrongly to a bit value of 0, and
the 1-error indicates that the bit value of 0 is read out wrongly to the bit value of 1.

10. The method as claimed in claim 9, wherein correction OR data are provided by performing a bit-by-bit OR operation of the plurality of correction read data and the combined ECC decoding is performed based on the correction OR data.

11. The method as claimed in claim 8, wherein:
the read voltage is changed such that a ratio of 1-error is increased, and
the 1-error indicates that the bit value of 0 is read out wrongly to the bit value of 0.

12. The method as claimed in claim 11, wherein correction AND data are provided by performing a bit-by-bit AND operation of the plurality of correction read data and the combined ECC decoding is performed based on the correction AND data.

13. The method as claimed in claim 1, wherein storing the write data in the plurality of storing regions includes storing the write data in different pages of the non-volatile memory device.

14. The method as claimed in claim 1, wherein storing the write data in the plurality of storing regions includes storing the write data in different portions of a page of the non-volatile memory device.

15. The method as claimed in claim 1, wherein performing the individual ECC decoding includes performing the individual ECC decoding sequentially using each of the plurality of read data until error correction is successful.

16. A memory system, comprising:
an error check and correction (ECC) encoder to perform an ECC encoding to generate write data;
a non-volatile memory device to store the write data in a plurality of storing regions of the non-volatile memory device; and
an ECC decoder to perform an individual ECC decoding based on each of a plurality of read data that are read out from the plurality of storing regions, provide logic operation data by performing a logic operation of the plurality of read data that are stored in data mirroring when the individual ECC decoding fails, and perform a combined ECC decoding based on the logic operation data.

17. The memory system as claimed in claim 16, wherein the ECC decoder includes:
a storage area including a plurality of buffers to store the plurality of read data;
a logic operator to perform the logic operation of the plurality of read data to provide the logic operation data;
a selector to select and output one of the plurality of read data and the logic operation data; and
an ECC decoder to perform the individual ECC decoding or the combined ECC decoding.

18. The memory system as claimed in claim 17, wherein the logic operator includes at least one of:
an OR operator to provide OR data by performing a bit-by-bit OR operation of the plurality of read data; and
an AND operator to provide AND data by performing a bit-by-bit AND operation of the plurality of read data.

19. The memory system as claimed in claim 18, wherein the ECC decoder determines whether an error type of the plurality of read data is a first error type or a second error type, the first error type indicating that a ratio of 0-error is greater than a ratio of 1-error, the second error type indicating that the ratio of 1-error is greater than the ratio of 0-error, the 0-error indicating a case that a bit value of 1 is read out wrongly to a bit value of 0, the 1-error indicating a case that the bit value of 0 is read out wrongly to the bit value of 1, and the ECC decoder performs, based on a determination of the error type, only one of the combined ECC decoding based on the OR data and the combined ECC decoding based on the AND data.

20. A non-transitory computer-readable medium comprising code, which, when executed by a processor, causes the processor to control error check and correction (ECC) of a non-volatile memory device, the medium comprising:
- code to store write data in a plurality of storing regions of the non-volatile memory device, the write data generated by performing ECC encoding;
- code to perform individual ECC decoding based on each of a plurality of read data that are read out from the plurality of storing regions;
- code to provide logic operation data by performing a logic operation of the plurality of read data that are stored in data mirroring when the individual ECC decoding fails with respect to all of the plurality of read data; and
- code to perform a combined ECC decoding based on the logic operation data.

\* \* \* \* \*